(12) United States Patent
Konishi et al.

(10) Patent No.: US 6,911,683 B2
(45) Date of Patent: Jun. 28, 2005

(54) SEMICONDUCTOR INTEGRATED CIRCUIT DEVICE

(75) Inventors: Satoru Konishi, Saku (JP); Mitsuaki Katagiri, Nishitokyo (JP); Kazumasa Yanagisawa, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/658,402

(22) Filed: Sep. 10, 2003

(65) Prior Publication Data

US 2004/0075157 A1 Apr. 22, 2004

(30) Foreign Application Priority Data

Sep. 26, 2002 (JP) ........................................ 2002-281607

(51) Int. Cl.⁷ .............................................. H01L 27/10
(52) U.S. Cl. ...................... 257/207; 257/202; 257/203; 257/208; 257/401
(58) Field of Search .............................. 257/202, 203, 257/207, 208, 401

(56) References Cited

U.S. PATENT DOCUMENTS

| | | | | |
|---|---|---|---|---|
| 5,365,091 A | * | 11/1994 | Yamagishi | 257/203 |
| 6,008,532 A | * | 12/1999 | Carichner | 257/691 |
| 6,078,068 A | * | 6/2000 | Tamura | 257/203 |
| 6,093,942 A | * | 7/2000 | Sei et al. | 257/203 |
| 6,339,234 B1 | * | 1/2002 | Takizawa | 257/203 |
| 6,798,069 B1 | * | 9/2004 | Ali et al. | 257/775 |
| 6,798,077 B2 | * | 9/2004 | Nakamura | 257/786 |

FOREIGN PATENT DOCUMENTS

JP          11-40754          2/1999

* cited by examiner

*Primary Examiner*—Tom Thomas
*Assistant Examiner*—Eugene Lee
(74) *Attorney, Agent, or Firm*—Mattingly, Stanger, Malur & Bundidge, P.C.

(57) ABSTRACT

A semiconductor integrated circuit device has a semiconductor substrate with a plurality of pads disposed over a main surface of the substrate along one side thereof. A plurality of input/output cells are disposed corresponding to the plural pads over the main surface of the substrate. An internal circuit forming section is disposed over the main surface of the substrate. Power supply wirings for the internal circuit supply potentials to the internal circuit forming section. The plural input/output cells include signal cells and power supply cells for internal circuit respectively. Signal pads are disposed corresponding to the signal cells and electrically connected the signal cells. Power supply pads for the internal circuit are respectively disposed corresponding to the power supply cells and electrically connected to the power supply cells and the power supply wirings.

16 Claims, 25 Drawing Sheets

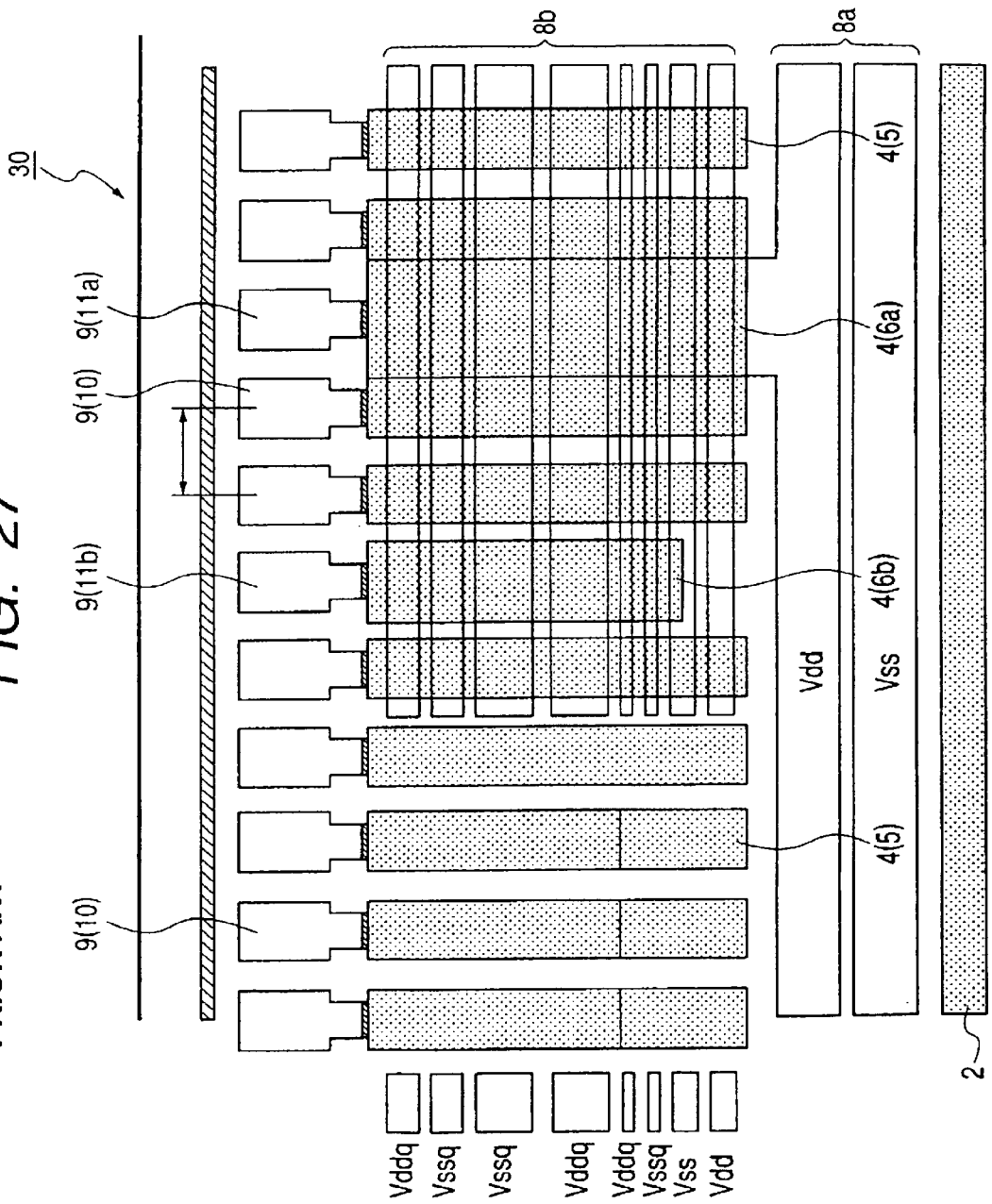

SEMICONDUCTOR INTEGRATED CIRCUIT DEVICE

BACKGROUND OF THE INVENTION

The present invention relates to a semiconductor integrated circuit device, and particularly to a technology effective if applied to a microcomputer mixed in one semiconductor chip with a logical operation circuit and a memory circuit.

A semiconductor integrated circuit device called, for example, a microcomputer is known as a semiconductor integrated circuit device. FIG. 26 is a typical plan view showing a layout of a conventional microcomputer, and FIG. 27 is a typical plan view showing part of FIG. 26 in an enlarged form.

As shown in FIG. 26, the conventional microcomputer is principally made up of a semiconductor chip 30 whose plane surface is square. An internal circuit forming section 2 is disposed in a central portion of a main surface of the semiconductor chip 30. Circuit blocks such as a logical operation circuit, a memory circuit, etc. are disposed in the internal circuit forming section 2 in plural form.

Four input/output cell forming sections 3 are disposed outside the internal circuit forming section 2 in association with the respective sides of the semiconductor chip 30. A plurality of bonding pads 9 are disposed outside the four input/output cell forming sections 3 along the respective sides of the semiconductor chip 30. As shown in FIG. 27, a plurality of input/output cells 4 are disposed in the four input/output cell forming sections 3 along their corresponding sides of the semiconductor chip 30. The input/output cells 4 are respectively disposed corresponding to the bonding pads 9.

Power supply wirings 8a for internal circuit, for supplying potentials to the internal circuit forming section 2 are disposed outside the internal circuit forming section 2 and outside the input/output cells 4. The power supply wirings 8a are shaped in the form of a ring that continuously extends over the periphery of the internal circuit forming section 2.

Power supply wirings 8b for input/output cells, for respectively supplying potentials to the input/output cells 4 are disposed outside the power supply wirings 8a and inside the bonding pads 9. The power supply wirings 8b are shaped in the form of a ring that continuously extends over the plural input/output cells 4 so as to surround the internal circuit forming section 2.

The plural input/output cells 4 include signal cells 5, power supply cells 6a for internal circuit, and power supply cells 6b for input/output cells. The plural bonding pads 9 include signal pads 10 respectively disposed corresponding to the signal cells 5 and electrically connected to the signal cells 5, power supply pads 11a for internal circuit, which are respectively disposed corresponding to the power supply cells 6a and electrically connected to the power supply cells 6a and the power supply wirings 8a, and power supply pads 11b for input/output cells, which are respectively disposed corresponding to the power supply cells 6b and electrically connected to the power supply cells 6b and the power supply wirings 8b.

Meanwhile, in the microcomputer, the number of bonding pads goes on increasing with its multifunctioning and high integration. In the microcomputer wherein the plural bonding pads 9 are disposed along the respective sides of the semiconductor chip as shown in FIG. 26, a plane size becomes large with an increase in the number of the bonding pads. Consequently, a technology for contriving the layout of bonding pads to thereby bring a semiconductor integrated circuit device into less size has been disclosed in Japanese Unexamined Patent Publication No. Hei 11(1999)-40754 (patent document 1 shown below). A technology for disposing a plurality of bonding pads along each side of a semiconductor chip in zigzag form has been described in the present patent document 1. As shown in FIG. 4 of the same patent document 1 and described in the paragraph number [0014] in the description of FIG. 4, the technology is also described in the patent document 1, that "outer peripheral and inner peripheral bonding pads 1a and 1b are used only for signals, and the innermost peripheral bonding pads 4 and 5 disposed inner than each buffer area are used only for a power supply and ground. Therefore, since all of areas conventionally secured in the buffer areas as for the power supply and ground can be used for a signal buffer 2, the size of the semiconductor chip can be reduced without depending on the numbers of power supply and ground pins that need to be provided over the chip. Further, the width of each of wirings 3 for connecting the outer peripheral and inner peripheral bonding pads 1a and 1b and buffer 2 can be sufficiently ensured".

Patent Document 1

Japanese Unexamined Patent Publication No. Hei 11(1999)-40754.

SUMMARY OF THE INVENTION

The present inventors have found out the following problems as a result of discussions about the conventional microcomputer.

As shown in FIG. 27, the power supply wirings 8a for internal circuit are respectively disposed inside the input/output cells 4. The power supply pads 11a for internal circuit, for respectively supplying potentials to the power supply wirings 8a are respectively disposed outside the input/output cells 4. Therefore, the distance between the power supply pad 11a and the power supply wiring 8a becomes long. When the distance from the power supply pad 11a to the power supply wiring 8a becomes long, the parasitic resistance of a wiring for wire-connecting the power supply pad 11a and the power supply wiring 8a becomes large and hence the characteristics of a power supply system are degraded. Therefore, the width of the connecting wiring becomes large and the parasitic resistance is reduced.

Each power supply cell 6a also needs an increase in its width to expand the width of the connecting wiring. When the input/output cells 4 different in width exist in mixed form, the array pitch between the input/output cells 4 is determined in matching with the widest input/output cell 4. Since the width of the power supply cell 6a of the signal cell 5, the power supply cell 6a and the power supply cell 6b becomes widest, the array pitch between the input/output cells 4 is determined in accordance with the power supply cell 6a. On the other hand, since the bonding pads 9 are disposed corresponding to the input/output cells 4, the array pitch between the bonding pads 9 is determined based on the array pitch between the input/output cells 4. That is, since the array pitch between the bonding pads 9 is determined according to the width of the power supply cell 6a, the miniaturization of the microcomputer (semiconductor integrated circuit device) falls into difficulties in such a layout that the width of the power supply cell 6a becomes large.

An object of the present invention is to provide a technology capable of holding or enhancing the characteristics of a semiconductor integrated circuit device and achieving a size reduction in the semiconductor integrated circuit device.

The above, other objects and novel features of the present invention will become apparent from the description of the present specification and the accompanying drawings.

Summaries of representative ones of the inventions disclosed in the present application will be described in brief as follows:

(1) There is provided a semiconductor integrated circuit device of the present invention, comprising:

a semiconductor substrate squared in plane surface;

a plurality of pads disposed over a main surface of the semiconductor substrate along one side of the semiconductor substrate;

a plurality of input/output cells disposed corresponding to the plural pads over main surface of the semiconductor substrate;

an internal circuit forming section disposed over the main surface of the semiconductor substrate and inner than the plural input/output cells; and power supply wirings for internal circuit, for supplying potentials to the internal circuit forming section, which are respectively disposed inner than the plural input/ output cells, wherein the plural input/output cells include signal cells and power supply cells for internal circuit respectively, wherein the plural pads include signal pads respectively disposed corresponding to the signal cells and electrically connected the signal cells, and power supply pads for internal circuit respectively disposed corresponding to the power supply cells and electrically connected to the power supply cells and the power supply wirings, and wherein the power supply pads are disposed closer to the power supply wirings than the signal pads.

(2) There is further provided a semiconductor integrated circuit device of the present invention, comprising:

a semiconductor substrate squared in plane surface;

a plurality of pads disposed over a main surface of the semiconductor substrate along one side of the semiconductor substrate;

a plurality of input/output cells respectively disposed corresponding to the plural pads over the main surface of the semiconductor substrate; and an internal circuit forming section disposed over the main surface of the semiconductor substrate and inner than the plural input/output cells, wherein the plural pads are respectively disposed inner than outer ends of the plural input/output cells.

BRIEF DESCRIPTION OF THE DRAWINGS

FIG. 27 is a typical cross-sectional view illustrating part of FIG. 26 in an enlarged form.

DETAILED DESCRIPTION OF THE PREFERRED EMBODIMENTS

Figure 1:
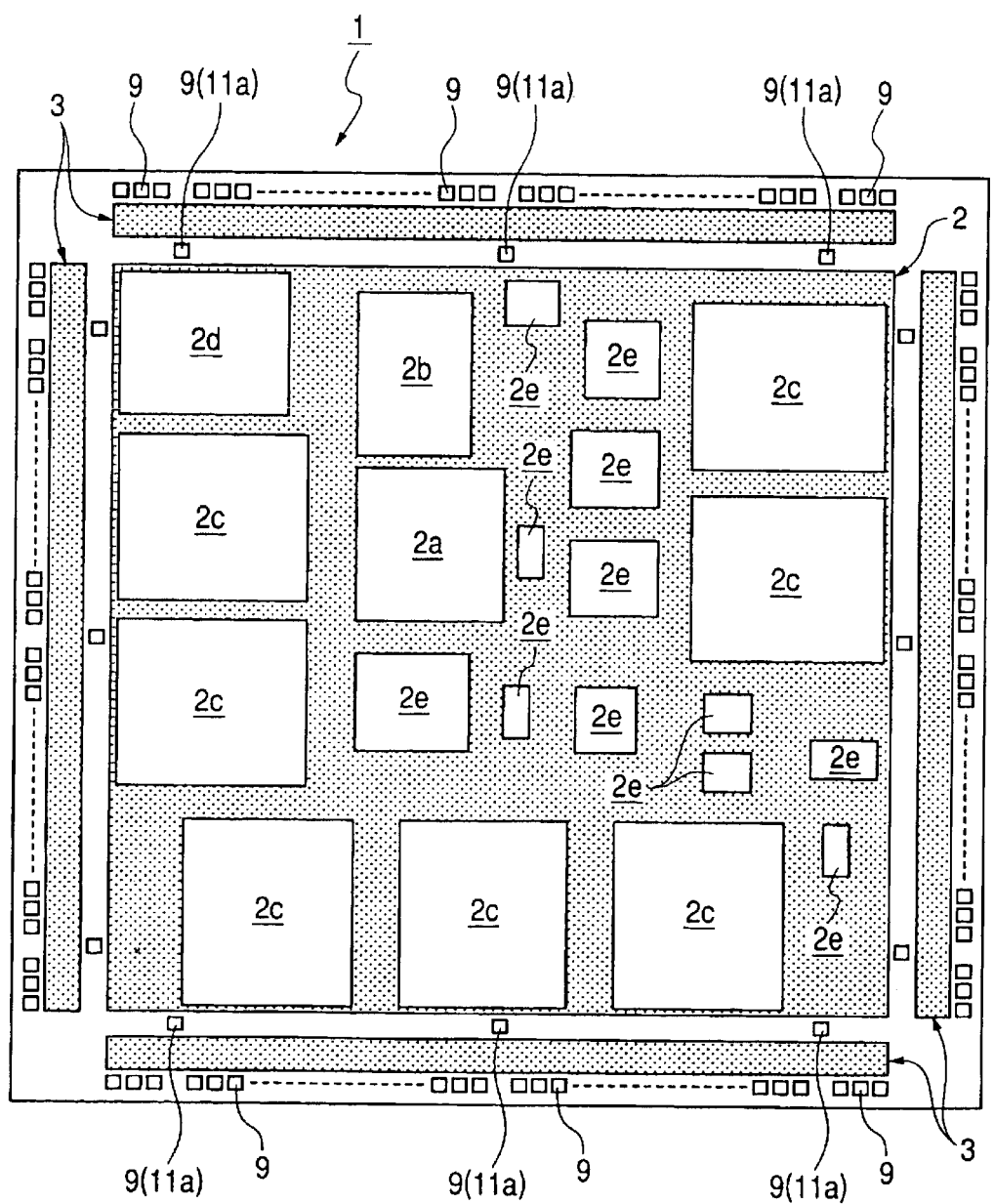
FIG. 1 is a typical plan view showing a layout of a semiconductor integrated circuit device illustrative of an embodiment 1 of the present invention.

Embodiments of the present invention will hereinafter be described in detail with reference to the accompanying drawings. Incidentally, components having the same functions in all the drawings for describing the embodiments of the present invention are respectively identified by the same reference numerals, and their repetitive description will therefore be omitted.

(Embodiment 1)

The present embodiment will explain an example in which power supply pads for internal circuit are disposed or laid out in the vicinity of internal power supply wirings rather than signal power supply pads.

Figure 2:
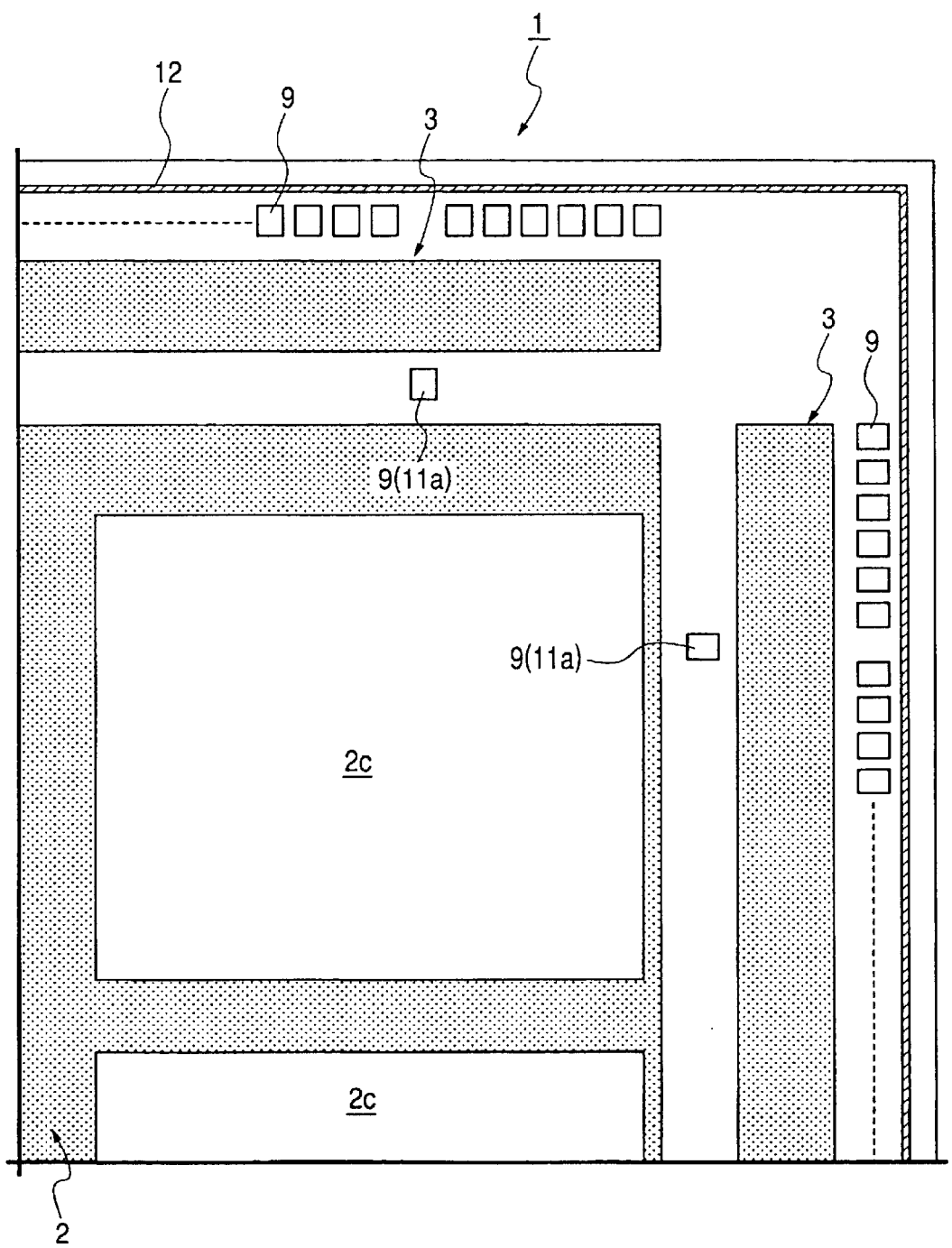
FIG. 2 is a typical plan view depicting part of FIG. 1 in an enlarged form.
Figure 3:
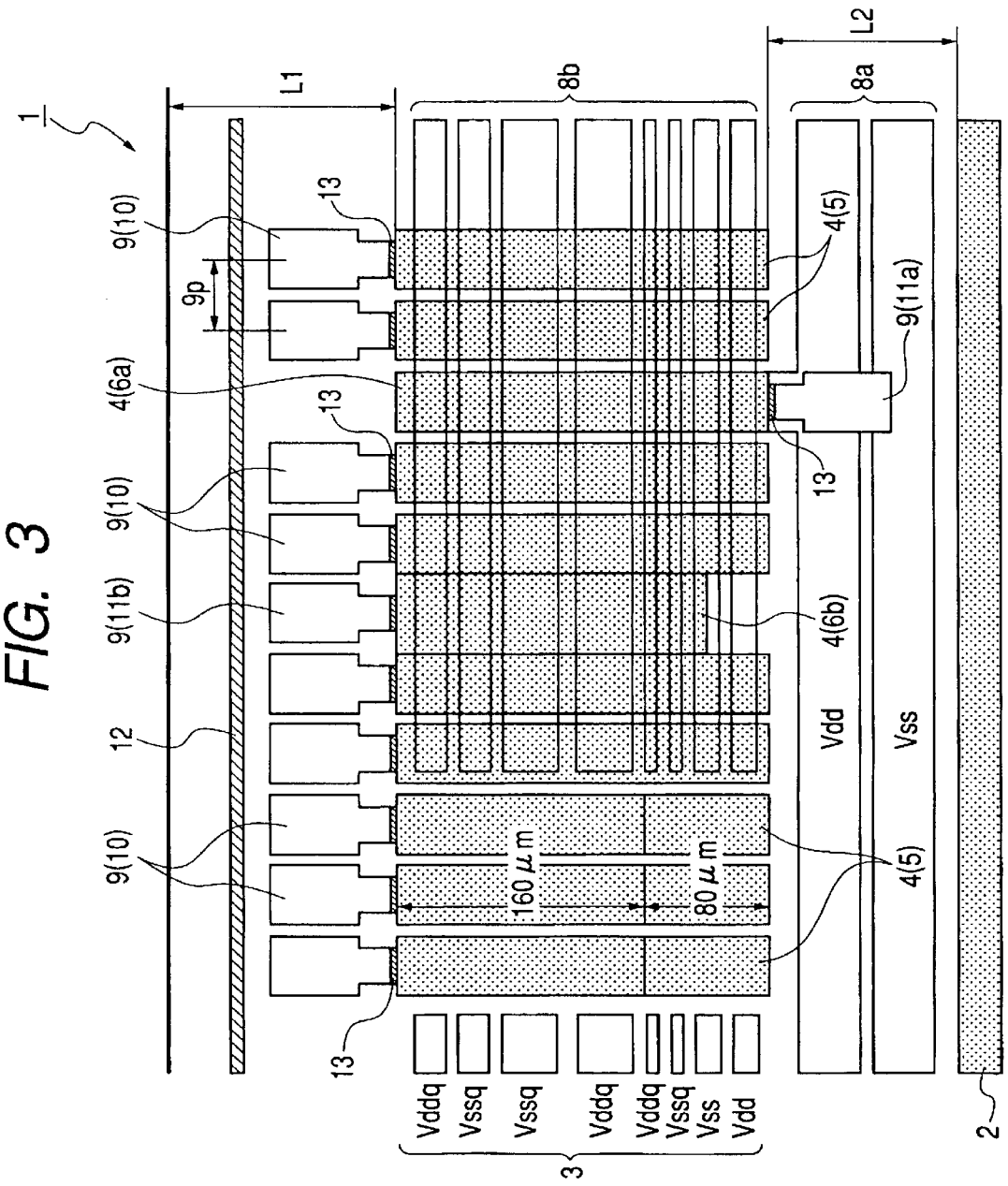
FIG. 3 is a typical plan view illustrating part of FIG. 2 in an enlarged form.
Figure 4:
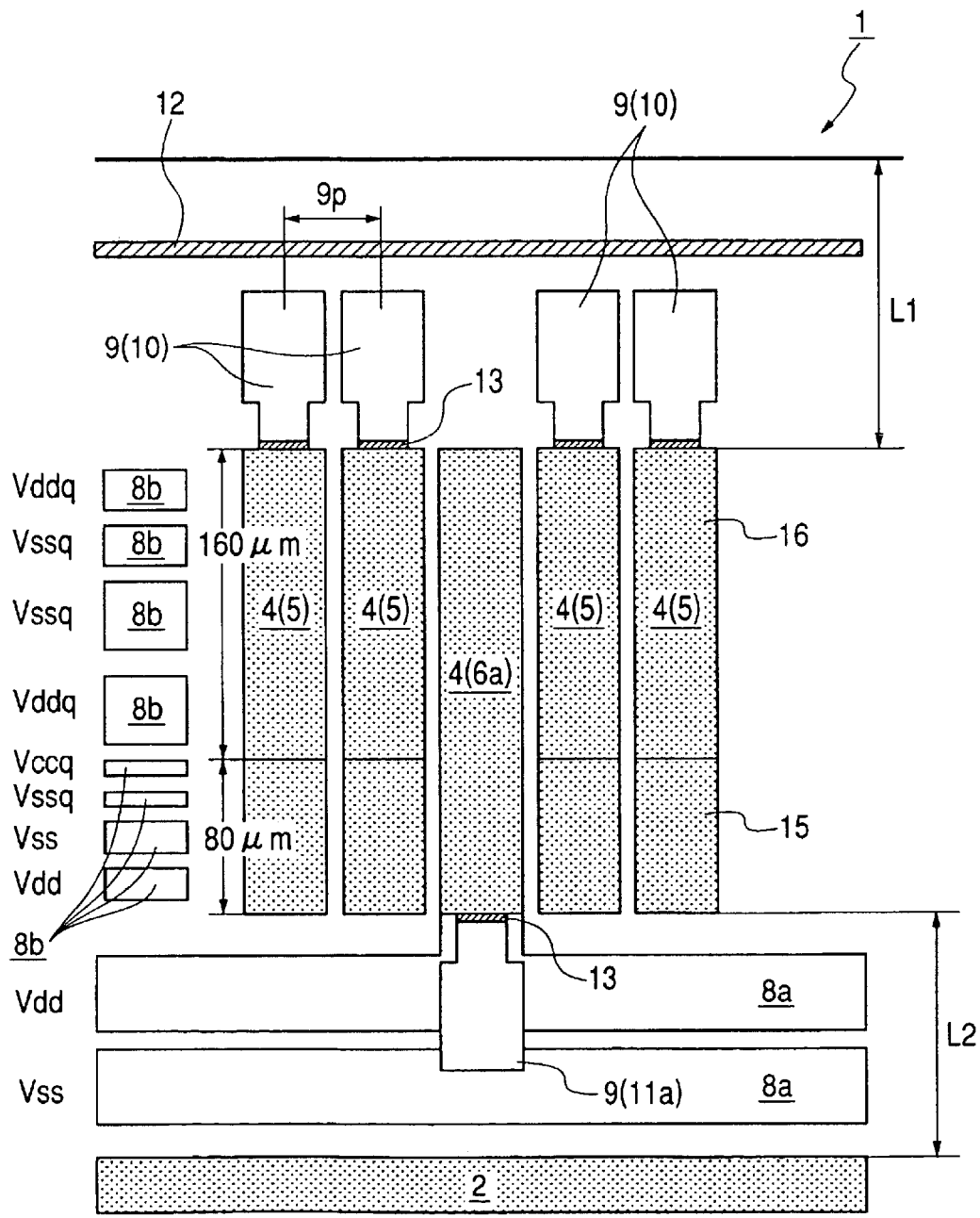
FIG. 4 is a typical plan view showing part of FIG. 3 in an enlarged form.
Figure 5:
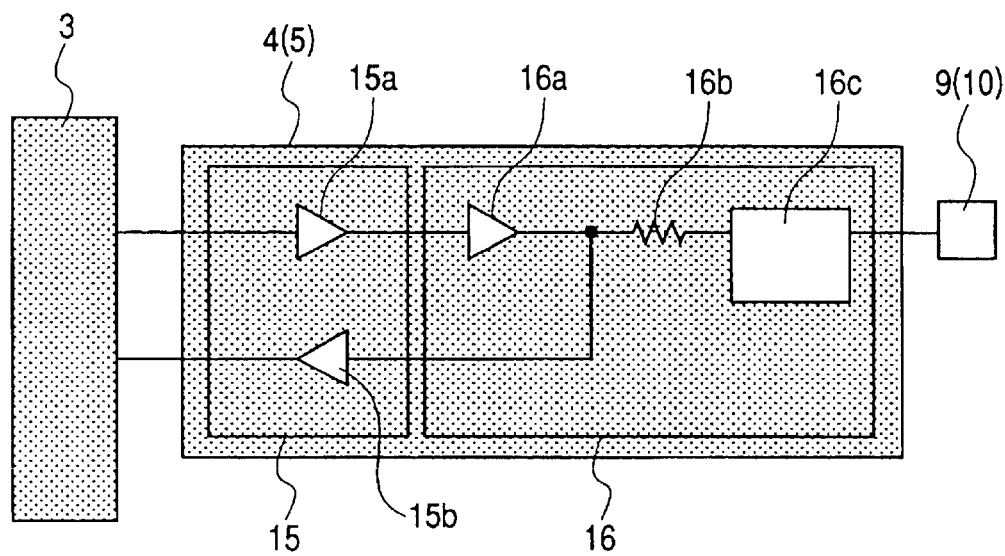
FIG. 5 is a block diagram depicting a schematic configuration of a signal cell shown in FIG. 4.
Figure 6:
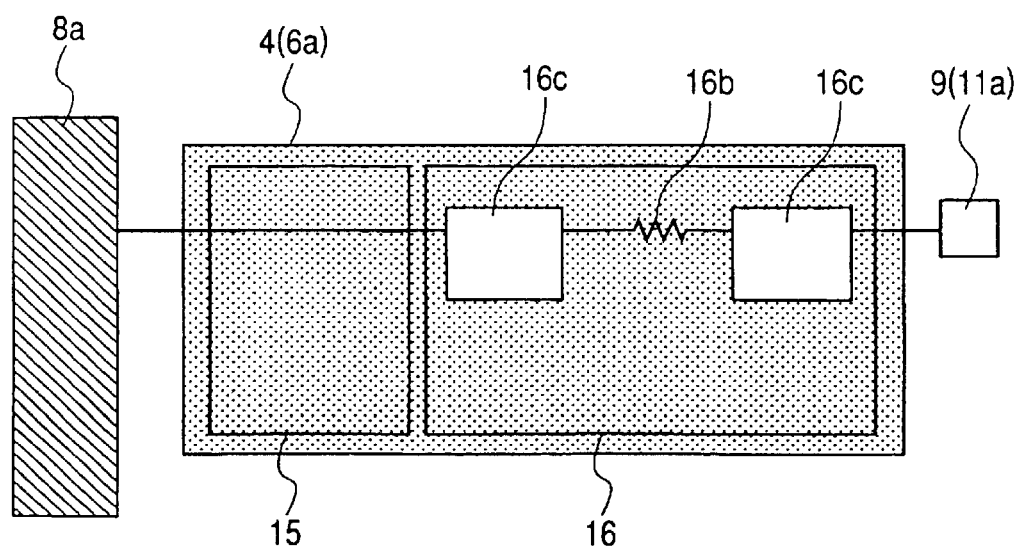
FIG. 6 is a block diagram illustrating a schematic configuration of a power supply cell for internal circuit, which is shown in FIG. 4.
Figure 7:
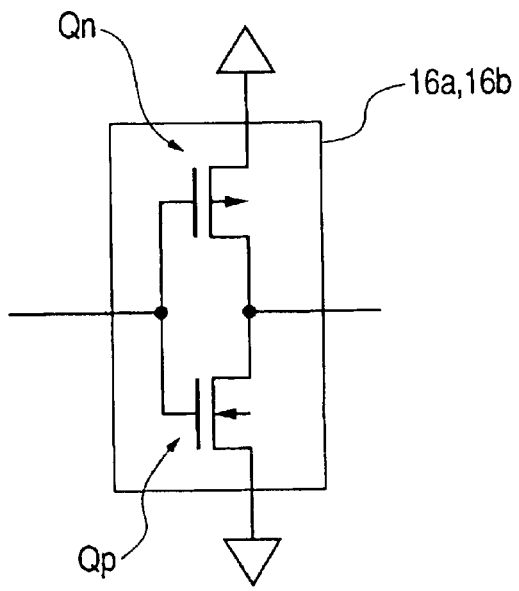
FIG. 7 is an equivalent circuit diagram showing one example of an input/output circuit mounted in the signal cell shown in FIG. 5.
Figure 8:
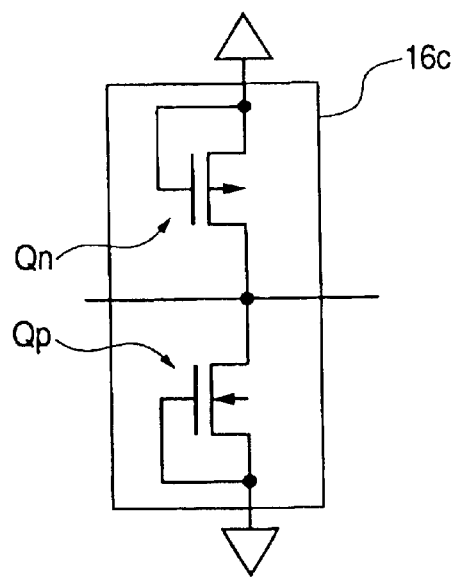
FIG. 8 is an equivalent circuit diagram illustrating one example of a protection circuit mounted in the signal cell shown in FIG. 5.
Figure 9:
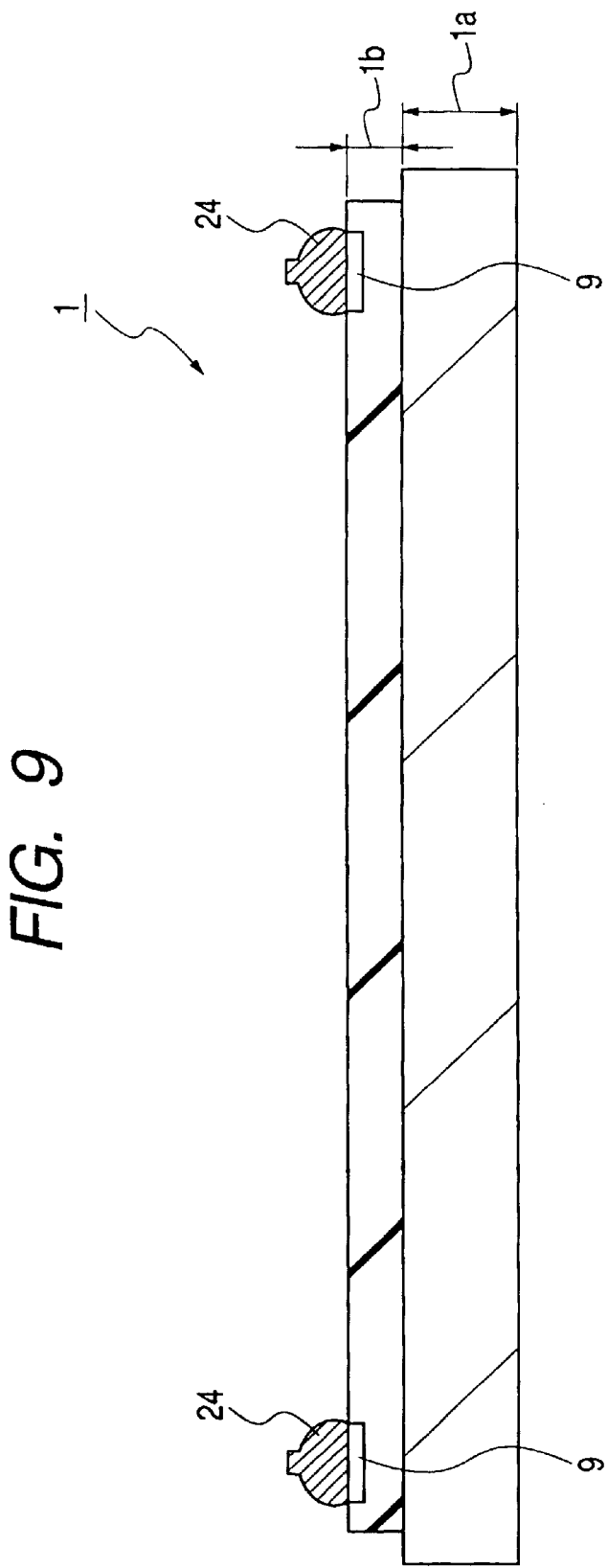
FIG. 9 is a typical cross-sectional view showing a schematic configuration of the semiconductor chip shown in FIG. 1.
Figure 10:
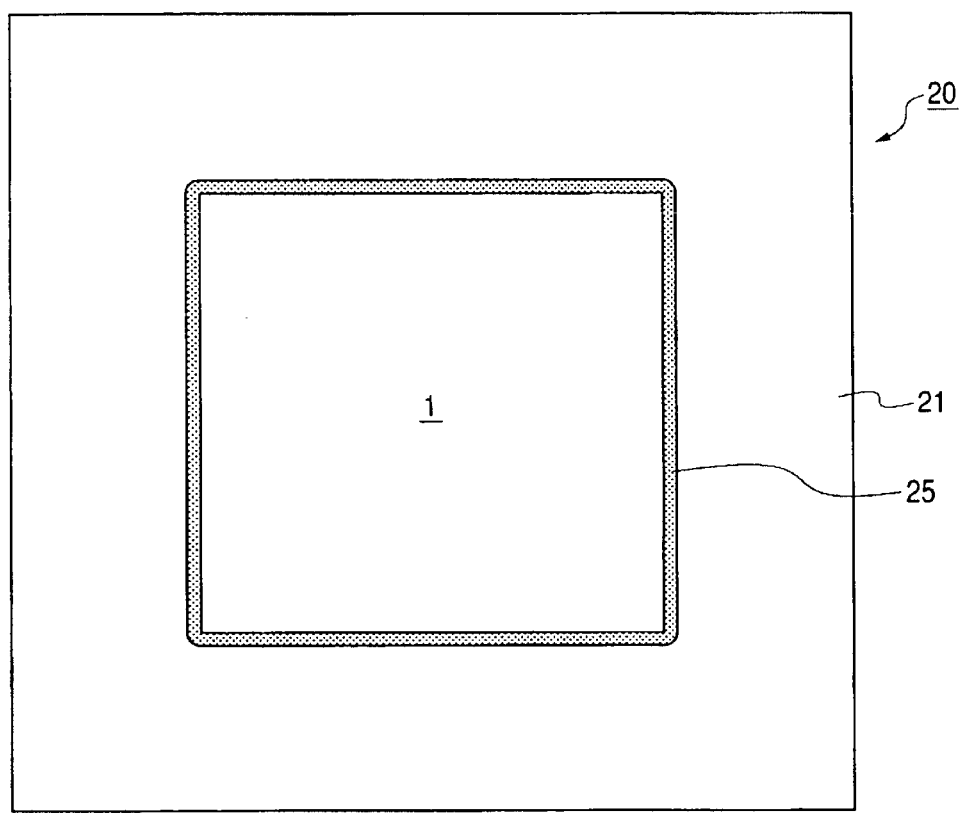
FIG. 10 is a typical plan view illustrating a schematic configuration of a BGA type semiconductor device in which the semiconductor integrated circuit device showing the embodiment 1 of the present invention is built.
Figure 11:
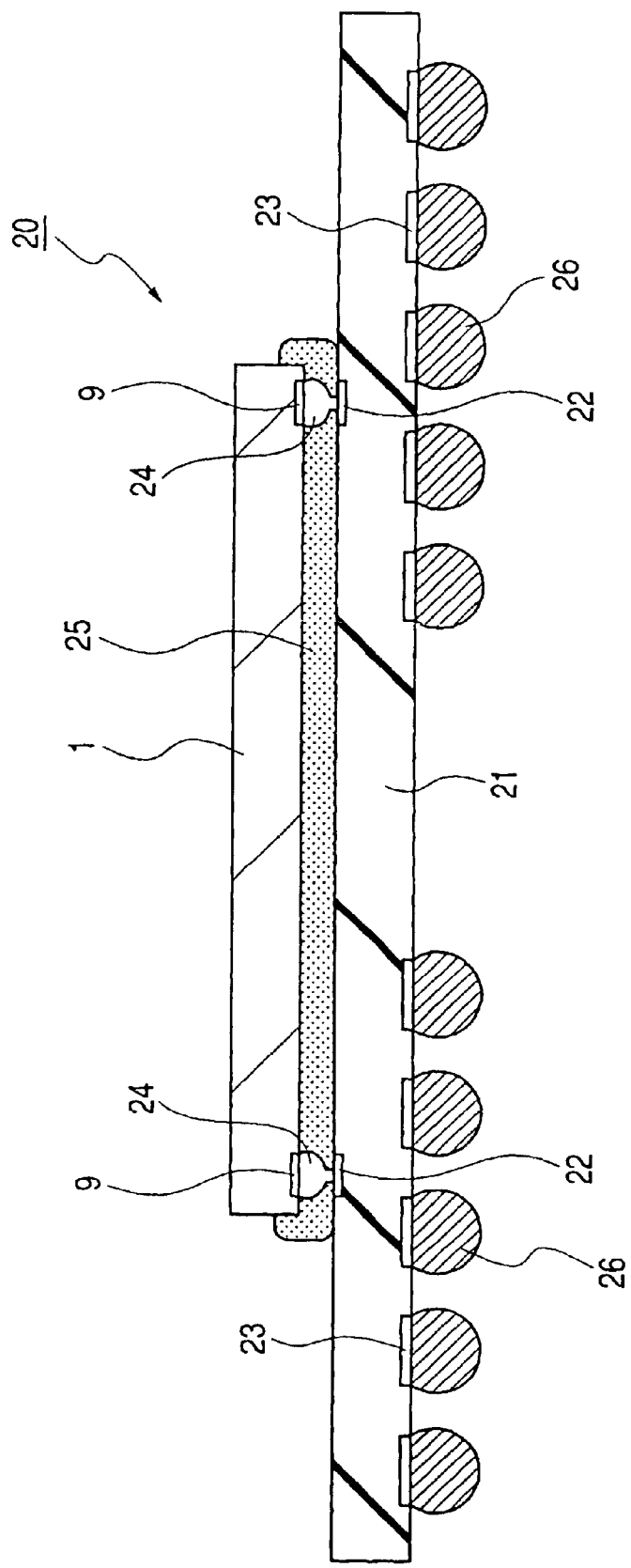
FIG. 11 is a typical cross-sectional view showing the schematic configuration of the BGA type semiconductor device shown in FIG. 10.
Figure 12:
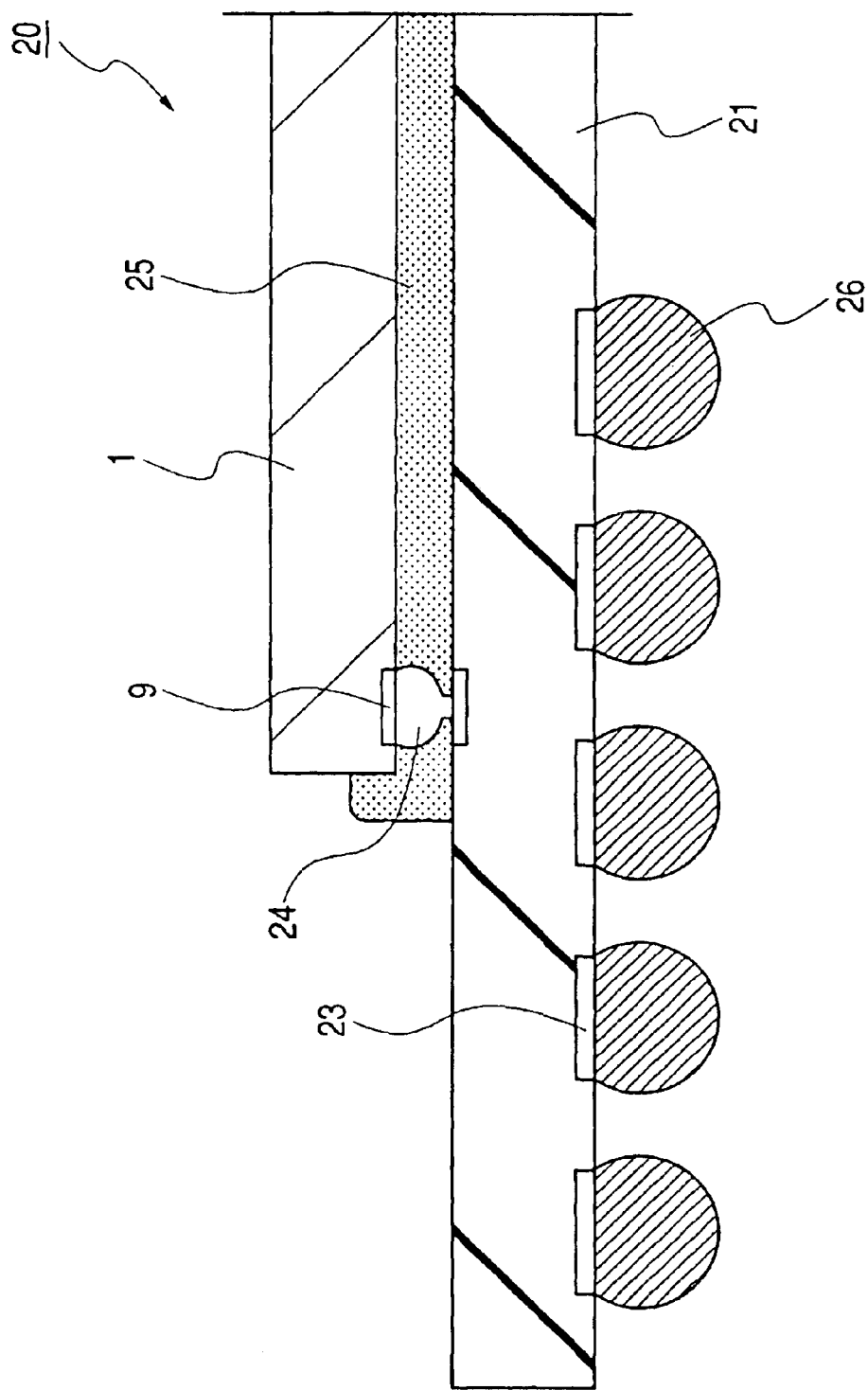
FIG. 12 is a typical cross-sectional view illustrating part of FIG. 11 in an enlarged form.

FIG. 1 is a typical plan view showing a layout of a microcomputer (semiconductor integrated circuit device) showing an embodiment 1;

FIG. 2 is a typical plan view depicting part of FIG. 1 in an enlarged form;

FIG. 3 is a typical plan view illustrating part of FIG. 2 in an enlarged form;

FIG. 4 is a typical plan view showing part of FIG. 3 in an enlarged form;

FIG. 5 is a block diagram depicting a schematic configuration of a signal cell shown in FIG. 4;

FIG. 6 is a block diagram illustrating a schematic configuration of a power supply cell for internal circuit, which is shown in FIG. 4;

FIG. 7 is an equivalent circuit diagram showing one example of an input/output circuit mounted in the signal cell shown in FIG. 5;

FIG. 8 is an equivalent circuit diagram illustrating one example of a protection circuit mounted in the signal cell shown in FIG. 5;

FIG. 9 is a typical cross-sectional view showing a schematic configuration of the semiconductor chip shown in FIG. 1;

FIG. 10 is a typical plan view illustrating a schematic configuration of a BGA type semiconductor device in which the semiconductor integrated circuit device (semiconductor chip) showing the embodiment 1 of the present invention is built;

FIG. 11 is a typical cross-sectional view showing the schematic configuration of the BGA type semiconductor device shown in FIG. 10; an FIG. 12 is a typical cross-sectional view illustrating part of FIG. 11 in an enlarged form.

The microcomputer according to the present embodiment 1 is principally made up of a semiconductor chip 1 as shown in FIG. 1. The semiconductor chip 1 has a plane shape intersecting its thickness direction, which is made square. In the present embodiment, the semiconductor chip 1 is shaped in the form of a square of about 5 mm×5 mm, for example. The semiconductor chip 1 is not necessarily limited to it but is configured so as to mainly have a semiconductor substrate 1a, a multilayered wiring layer 1b formed by laminating insulating and wiring layers over a main surface of the semiconductor substrate 1a in plural stages, respectively, and a surface protective film (final protective film) formed so as to cover the multilayered wiring layer. The insulating layer is formed of an oxide silicon film, for example. The wiring layer is formed of a metal film such as aluminum (Al), an aluminum alloy, copper (Cu), or a copper alloy. The surface protective film is formed of, for example, a multilayer film obtained by stacking an inorganic insulating film such as an oxide silicon film or a nitride silicon film, and an organic insulating film on each other. The semiconductor chip 1 according to the present embodiment takes a metal wiring structure of six layers, for example.

As shown in FIGS. 1 and 2, an internal circuit forming section 2 is disposed in a central portion of a main surface (over the main surface of the semiconductor substrate 1a) of the semiconductor chip 1. A plurality of circuit blocks partitioned by wiring channel areas are disposed in the internal circuit forming section 2. A CPU (Central Processing Unit) is disposed in a circuit block 2a, a DSP (Digital Signal Processor) is disposed in a circuit block 2b, a RAM (Random Access Memory) is disposed in each circuit block 2c as a memory circuit, a peripheral circuit is disposed in a circuit block 2d, and various controllers are respectively disposed in circuit blocks 2e.

Four input/output cell forming sections 3 are disposed over the main surface (the main surface of the semiconductor substrate 1a) of the semiconductor chip 1 and on the outer side of the internal circuit forming section 2 so as to correspond to the respective sides (the respective sides of the semiconductor substrate 1a) of the semiconductor chip 1. A plurality of bonding pads 9 are disposed over the main surface of the semiconductor chip 1 and on the outer sides of the input/output cell forming sections 3 along the respective sides of the semiconductor chip 1. As shown in FIG. 3, a plurality of input/output cells 4 are disposed in the four input/output cell forming sections 3 along the sides of the semiconductor chip 1, which are respectively associated therewith. The input/output cells 4 are disposed in association with the bonding pads 9 respectively.

A plurality of power supply wirings 8a for internal circuit, for respectively supplying potentials to the internal circuit forming section 2 are disposed on the outer side of the internal circuit forming section 2 and inside the input/output cells 4. The power supply wirings 8a are laid out in the form of a ring which continuously extends over the periphery of the internal circuit forming section 2.

A plurality of power supply wirings 8b for input/output cells, for respectively supplying potentials to the input/output cells 4 are disposed over the input/output cell forming sections 3. The power supply wirings 8b are laid out in the form of a ring which continuously extends over the plural input/output cells 4, so as to surround the internal circuit forming section 2.

The plural input/output cells 4 respectively include signal cells 5, power supply cells 6a for internal circuit, and power supply cells 6b for input/output circuits. The plural bonding pads 9 include signal pads 10 respectively disposed corresponding to the signal cells 5 and electrically connected to the signal cells 5, power supply pads 11a for internal circuit, which are respectively disposed corresponding to the power supply cells 6a and electrically connected to the power supply cells 6a and the power supply wirings 8a, and power supply pads 11b for input/output cells, which are respectively disposed corresponding to the power supply cells 6b and electrically connected to the power supply cells 6b and the power supply wirings 8b.

Each of the power supply pads 11a includes a power supply pad to which a Vss potential (0V, for example) is applied, and a power supply pad to which a Vdd potential (2.5V, for example) higher than the Vss potential is applied. Each of the power supply pads 11b includes a power supply pad to which a Vssq potential (0V, for example) is applied, a power supply pad to which a Vddq potential (3.3V, for example) higher than the Vssq potential is applied, and a power supply pad to which the Vss potential is applied, and a power supply pad to which the Vdd potential is applied.

The plural power supply wirings 8a include wirings fixed to the Vss potential, and wirings fixed to the Vdd potential.

The power supply wirings 8b include wirings fixed to the Vssq potential, wirings fixed to the Vddq potential (3.3V, for example), wirings fixed to the Vss potential, and wirings fixed to the Vdd potential.

Each of the signal cells 5 is a cell including a circuit for transmitting/receiving an input/output signal, each of the power supply cells 6a is a cell for supplying a potential to each of the internal circuit and a circuit that needs a power supply identical in potential to the internal circuit, and each of the power supply cells 6b is a cell for supplying a potential to each of a final stage transistor of an output circuit for driving an external load (the outside of an LSI), and a circuit that needs a power supply identical in potential to the final stage transistor.

A guard ring 12 is disposed between the plural bonding pads 9 and the sides of the semiconductor chip 1. The guard ring 12 continuously extends along the respective sides of the semiconductor chip 1. The bonding pads 9 are formed in a metal wiring layer corresponding to a sixth layer, for example, and the power supply wirings 8a and power supply wirings 8b are respectively formed in a metal wiring layer corresponding to a fifth layer, for example.

As shown in FIG. 4, the signal cell 5 is configured so as to have a logic area 15 and a final stage area 16. The logic area 15 of the signal cell 5 is disposed on the side of the semiconductor chip 1 rather than the final stage area 16. As shown in FIG. 5, for example, an output circuit 15a and an input circuit 15b, and the like are disposed in the logic area 15 of the signal cell 5. A final stage output circuit 16a, a protective resistive element 16b and a protective circuit 16c, and the like are disposed in the final stage area 16 of the signal cell 5.

Each of the output circuit 15a, input circuit 15b and final stage output circuit 16a comprises an inverter circuit made up of an n channel conductivity-type MISFET-Qn and a p channel conductivity-type MISFET-Qp such as shown in FIG. 7, for example. A single MISFET is used for each of the output circuit 15a and the input circuit 15b. An output MISFET configured by connecting a plurality of MISFETs in parallel is used for the final stage output circuit 16a.

The protective circuit 16c comprises an n type MISFET-Qn and a p type MISFET-Qp for clamping such as shown in FIG. 8 by way of example, which have gate and source electrodes respectively connected to one another. The protective resistive element 16b is made up of a polysilicon resistance, for example.

As shown in FIG. 6, the power supply cell 6a is configured so as to have a logic area 15 and a final stage area 16. No circuit is configured in the logic area 15 of the power supply cell 6a. Two protective circuits 16c and one protective resistive element 16b are disposed in the final stage area 16 of the power supply cell 6a. In the present embodiment, the final stage area 16 of the power supply cell 6a is configured so as to have the two protective circuits 16c. However, one (the protective circuit 16c disposed between the protective resistive element 16b and its corresponding power supply pad 11a) located on the right side as one faces FIG. 6 may be adopted as the protective circuit 16c.

As shown in FIGS. 3 and 4, the signal cell 5 and the signal pad 10 are electrically connected to each other via a connecting portion 13 provided at a leading end on the final stage area 16 side of the signal cell 5. The power supply cell 6a and the power supply pad 11a are electrically connected to each other via a connecting portion 13 provided at a leading end on the final stage area 16 side of the power supply cell 6a. The power supply cell 6b and the power supply pad 11b are electrically connected to each other via a connecting portion 13 provided at a leading end on the final stage area 16 side of the power supply cell 6b.

In the present embodiment, the distance L1 between the side of the semiconductor chip 1 and the outer end of each input/output cell 4 is set to about 150 μm, for example. The distance L2 between the inner end of each input/output cell 4 and the internal circuit forming section 2 is set to about 120 μm, for example. Each of the signal cell 5 and the power supply cell 6a is about 240 μm in length and about 40 μm in width, for example. The power supply cell 6b is about 200 μm in length and about 50 μm in width, for example. An array pitch 9p between the electrode pads 9 is set to about 50 μm, for example.

The signal pad 10 is disposed outer than the input/output cell 4, and each of the power supply wirings 8a is disposed inner than the input/output cell 4. The power supply pad 11a is disposed inner than the input/output cell 4 and laid out so as to overlap with the power supply wiring 8a in a plane manner. That is, the power supply pad 11a is disposed closer to the power supply wiring 8a than the signal pad 10. While the power supply cell 6a in FIGS. 3 and 4 is directly connected even to Vdd of the power supply wiring 8a and represents a Vdd power supply cell, it is directly connected to another Vss of the power supply wiring 8a and also includes an expression as a Vss power supply cell.

The distance between the power supply pad 11a and the power supply wiring 8a becomes short as the power supply pad 11a approaches the power supply wiring 8a. A parasitic resistance of a connecting wiring for wire-connecting the power supply pad 11a and the power supply wiring 8a also becomes small. Since there is no need to increase the width of the connecting wiring if the parasitic resistance of the connecting wiring becomes small, the width of each power supply cell 6a can be narrowed. Thus, since the width of the power supply cell 6a can be narrowed owing to the placement of the power supply pad 11a closer to the power supply wiring 8a than the signal pad 10, the array pitch between the input/output cells 4 can be narrowed. As a result, the array pitch 9p between the adjoining bonding pads 9, which is determined based on the array pitch between the input/output cells 4, can be narrowed. It is therefore possible to scale down or miniaturize the semiconductor chip 1, i.e., bring the microcomputer into less size.

FIG. 10 is a typical plan view showing a schematic configuration of a BGA type semiconductor device in which the microcomputer (semiconductor chip 1) according to the present invention is built.

FIG. 11 is a typical cross-sectional view showing a schematic configuration of the BGA type semiconductor device shown in FIG. 10, and FIG. 12 is a typical cross-sectional view showing part of FIG. 11 in an enlarged form.

As shown in FIGS. 10 through 12, the BGA type semiconductor device 20 has a configuration wherein the semiconductor chip 1 is mounted on the main surface side of a wiring board 21 called an interposer, and a plurality of solder bumps (solder balls) 26 are disposed on the back surface side opposite to the main surface of the wiring board 21 as external connecting terminals.

As shown in FIG. 9, a plurality of stud bumps 24 made of, for example, Au are disposed over the main surface of the semiconductor chip 1 as protruded electrodes. The plural stud bumps 24 are respectively disposed on a plurality of bonding pads 9 disposed over the main surface of the semiconductor chip 1 and electrically and mechanically connected thereto. The stud bumps 24 are formed by, for example, a ball bonding method using Au wires and utilizing a supersonic vibration in combination with thermocompression bonding. The ball bonding method is a method for forming balls at leading ends of the Au wires and thereafter cutting the Au wires from the ball portions to thereby form bumps. Accordingly, impact caused by crimping upon formation of the stud bumps is applied to the semiconductor chip 1 using the stud bumps 24 as the protruded electrodes.

As shown in FIGS. 11 and 12, a plurality of pads 22 are respectively disposed over the main surface of the wiring board 21 in association with the bonding pads 9 of the semiconductor chip 1. A plurality of pads 23 are disposed over the back surface of the semiconductor chip 1. The solder bumps 26 are fixedly secured to their corresponding pads 23 and electrically and mechanically connected thereto.

The semiconductor chip 1 is packaged in a state of its main surface being face-to-face with the wiring board 21. For instance, an anisotropic conductive resin 25 is interposed between the semiconductor chip 1 and the wiring board 21 as an adhesive resin. The semiconductor chip 1 is bonded and fixed to the wiring board 21 by the anisotropic conductive resin 25. For example, one in which a number of conductive particles are mixed into an epoxy thermosetting resin, for example, is used as the anisotropic conductive resin 25.

After, for example, a semiconductor wafer is diced into individual semiconductor chips 1, the stud pads 24 are formed on their corresponding bonding pads 9 of each semiconductor chip 1 by the ball bonding method. The packaging of the semiconductor chip 1 is performed by disposing the film-shaped anisotropic conductive resin 25 in a chip mounting area of the main surface of the wiring board 21 and thereafter crimping the semiconductor chip 1 with a bonding tool while applying heat in a state in which the anisotropic conductive resin 25 is being interposed between the wiring board 21 and the semiconductor chip 1. Incidentally, as the adhesive resin, a paste-like anisotropic conductive film (ACP: Anisotropic Conductive Paste), a sheet-like nonconductive resin (NCF: Non Conductive Film), or the like may be used in addition to a film-shaped anisotropic conductive resin (ACF: Anisotropic Conductive Film).

The stud pads 24 are respectively interposed between the bonding pads 9 of the semiconductor chip 1 and the pads 22 of the wiring board 21 and electrically connect the pads 9 and pads 22 to one another. The stud pads 24 are press-fit to their corresponding pads 22 of the wiring board 21 by a heat contraction force (contraction force developed when the anisotropic conductive resin 25 is restored from a heated state to the room temperature) of the anisotropic conductive resin 25 interposed between the wiring board 21 and the semiconductor chip 1 or a thermosetting contraction force (contraction force developed upon curing of the thermosetting resin), or the like. Any circuit that is in danger of degradation in its characteristic and its breakdown due to stress or impact, is not normally disposed below the pads because of stress at their press-fitting and impact at the formation of the stud bumps. However, even if the pads are disposed over the power supply wirings 8a, the influence on the circuit characteristics is almost not caused because a micro-fabricated transistor sensitive to the stress or impact is not disposed.

Since the plane size of the wiring board 21 can be reduced by miniaturization of the semiconductor chip 1 in the BGA type semiconductor device 20 configured in this way, the BGA type semiconductor device 20 can also be scaled down with the miniaturization of the semiconductor chip 1.

(Embodiment 2)

The present embodiment will explain an example in which bonding pads are disposed on input/output cells.

Figure 13:
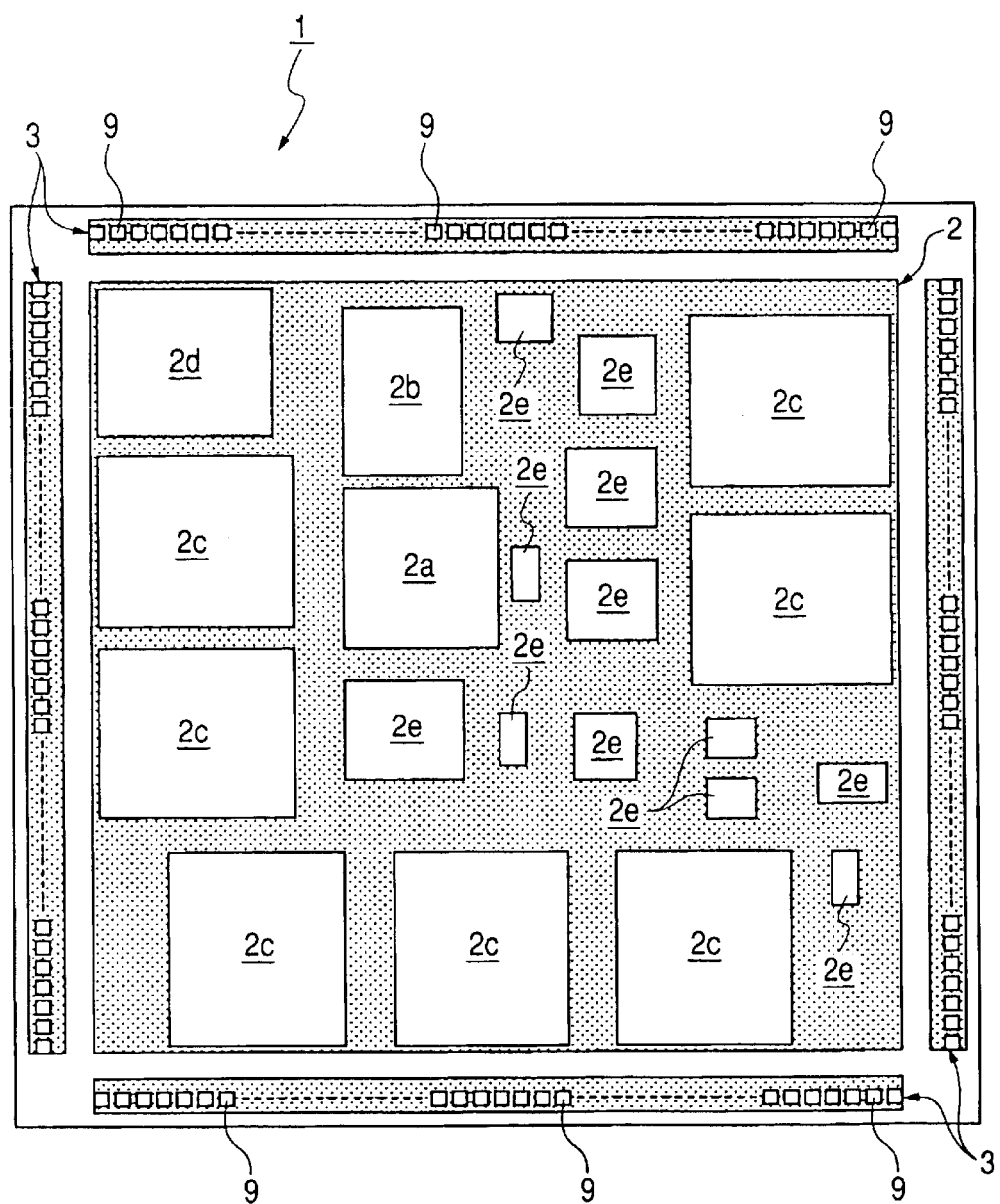
FIG. 13 is a typical plan view showing a layout of a semiconductor integrated circuit device illustrative of an embodiment 2 of the present invention.
Figure 14:
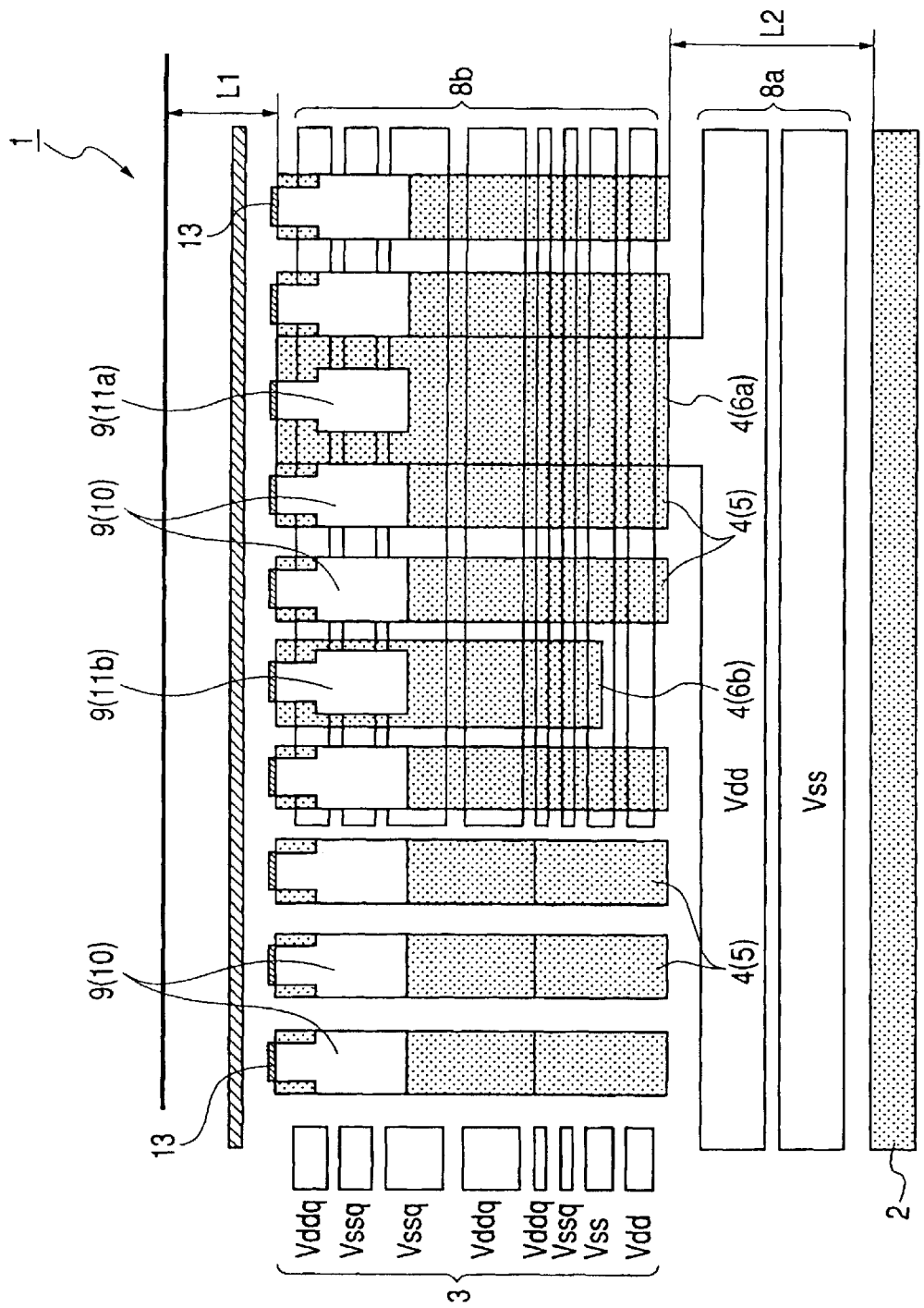
FIG. 14 is a typical plan view depicting part of FIG. 13 in an enlarged form.

FIG. 13 is a typical plan view showing a layout of a microcomputer illustrative of the present embodiment 2, and FIG. 14 is a typical plan view showing part of FIG. 13 in an enlarged form.

As shown in FIGS. 13 and 14, a plurality of bonding pads 9 are disposed inner than outer ends of their corresponding input/output cells 4. In the present embodiment, the plural bonding pads 9 are disposed so as to overlap with their corresponding input/output cells in a plane manner. Owing to the provision of such a configuration, the distance L1 between the side of a semiconductor chip 1 and the outer end of each input/output cell 4 can be shortened. It is therefore possible to bring the semiconductor chip 1 (microcomputer) into less size.

Although any circuit that is in danger of degradation in its characteristic and its breakdown due to stress or impact, is not normally disposed below the pads because of stress at press-fitting and impact at the formation of stud bumps, the influence on circuit characteristics is almost not caused because a micro-fabricated transistor sensitive to the stress or impact is not disposed, even if pads are disposed over their corresponding final stage areas 16 of each input/output forming section 3.

(Embodiment 3)

Figure 15:
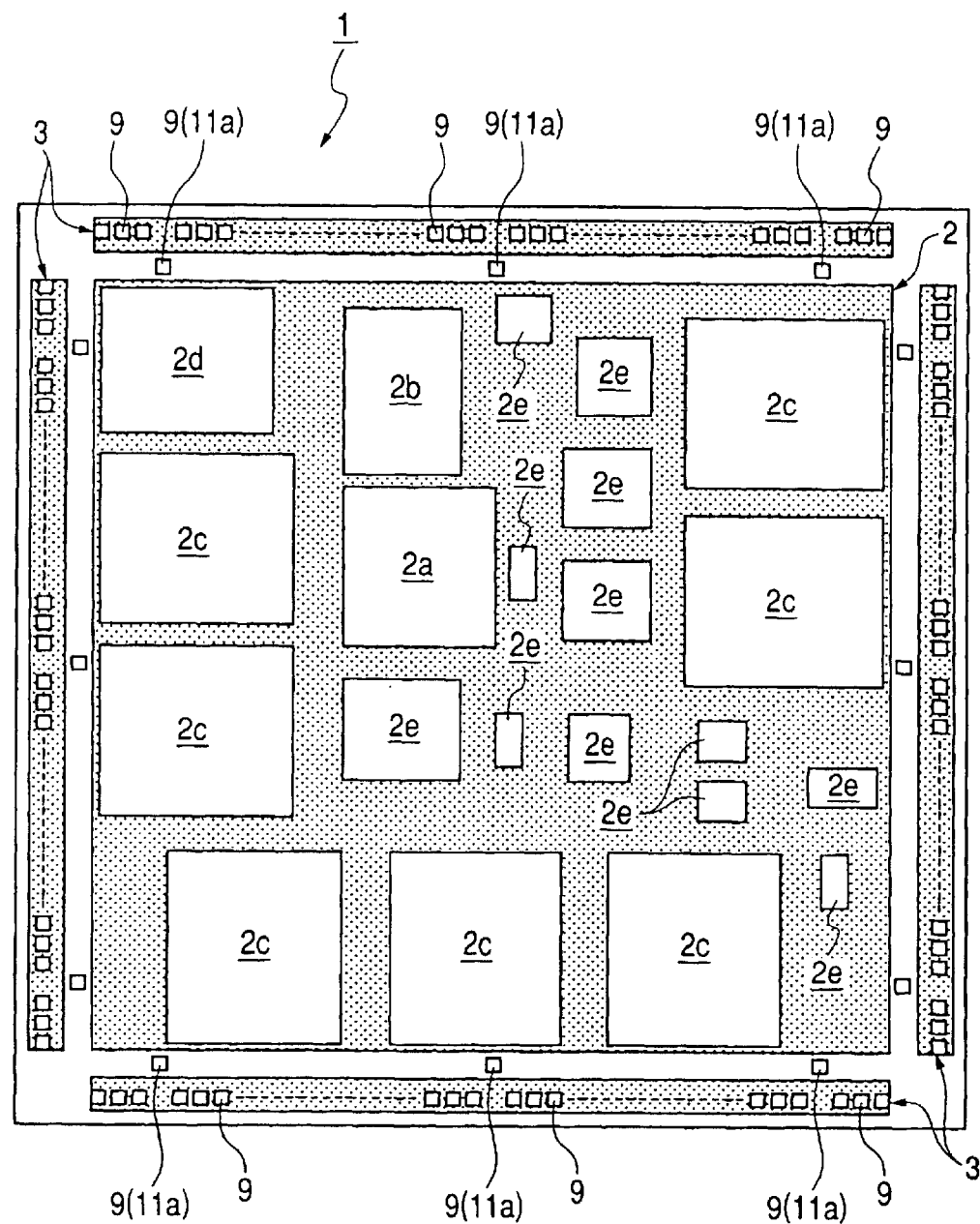
FIG. 15 is a typical plan view showing a layout of a semiconductor integrated circuit device illustrative of an embodiment 3 of the present invention.
Figure 16:
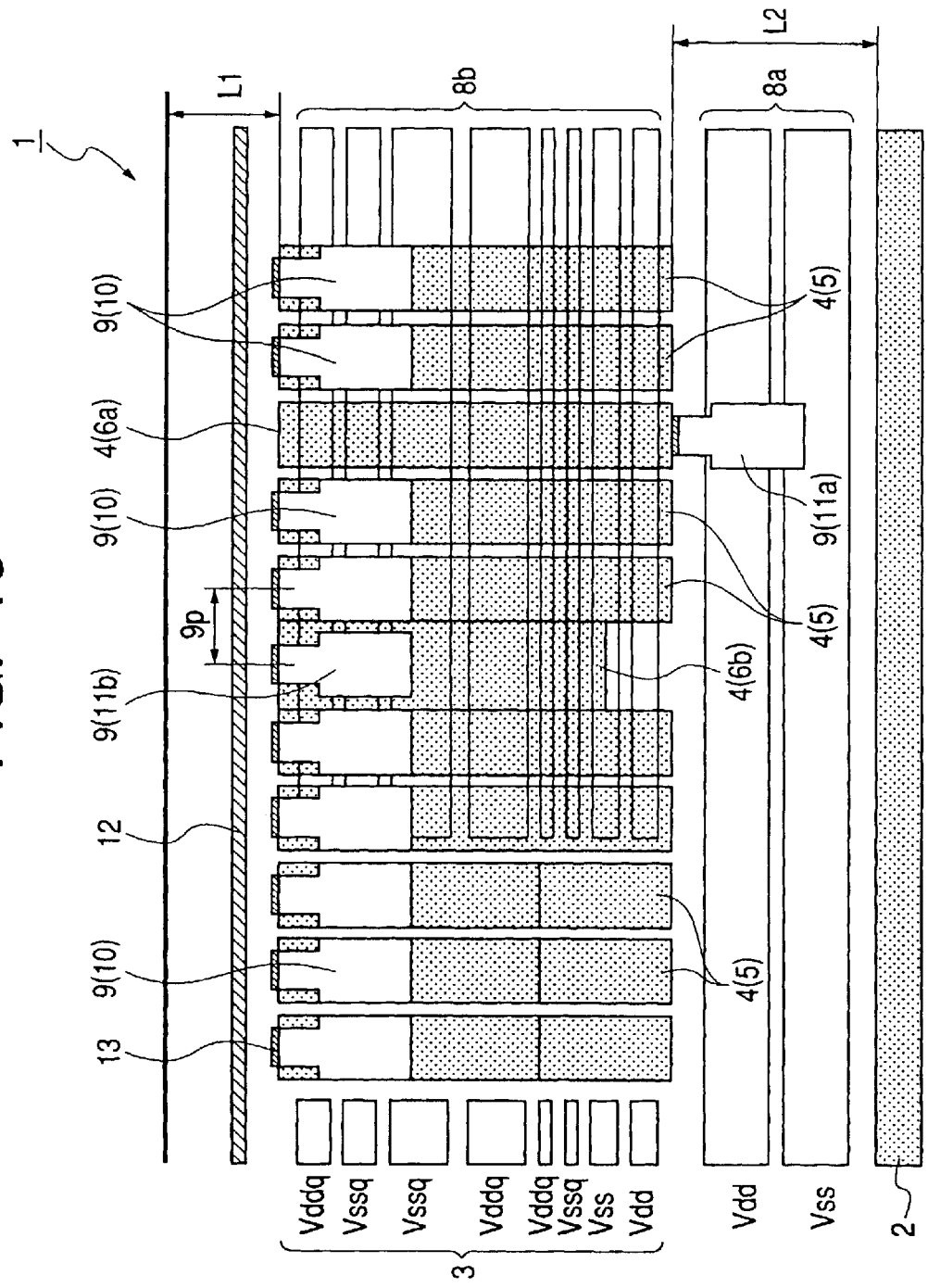
FIG. 16 is a typical plan view illustrating part of FIG. 15 in an enlarged form.

FIG. 15 is a typical plan view showing a layout of a microcomputer illustrative of the present embodiment 3, and FIG. 16 is a typical plan view showing part of FIG. 15 in an enlarged form.

As shown in FIGS. 15 and 16, power supply pads 11a for internal circuit are respectively disposed inner than input/output cells 4 and disposed so as to overlap with power supply wirings 8a for internal circuit in a plane manner. Signal pads 10 and power supply pads 11b for input/output cells are disposed so as to overlap with their corresponding input/output cells 4 in a plane manner. Therefore, the width of each power supply cell 6a for internal circuit can be narrowed. Owing to the provision of such a configuration, the semiconductor chip 1 (microcomputer) can be made smaller-sized.

(Embodiment 4)

Figure 17:
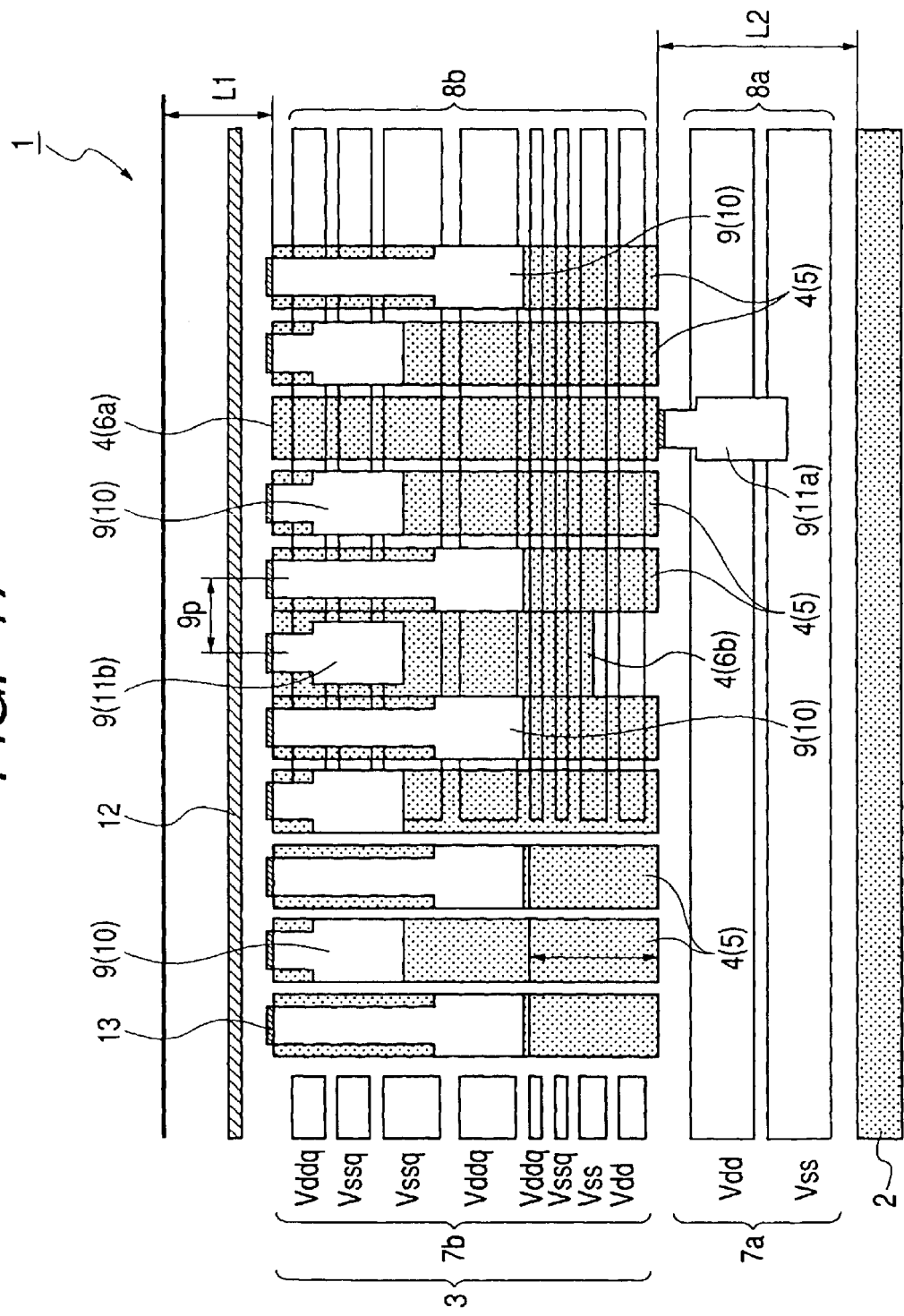
FIG. 17 is a typical plan view showing a layout of a semiconductor integrated circuit device illustrative of an embodiment 4 of the present invention.

FIG. 17 is a typical plan view showing a layout of part of a microcomputer illustrative of the present embodiment 4.

As shown in FIG. 17, power supply pads 11a for internal circuit are respectively disposed inner than input/output cells 4 and laid out so as to overlap with power supply wirings 8a for internal circuit in a plane manner. Signal pads 10 and power supply pads 11b for input/output cells are disposed so as to overlap with their corresponding input/output cells 4 in a plane manner. A plurality of bonding pads 9 are arranged in a zigzag arrangement in which first pads 9 located on the side of a semiconductor chip 1 and second pads 9 located away from the first pads 9 as viewed from the side of the semiconductor chip 1 are alternately and repeatedly disposed along each side of the semiconductor chip 1. Owing to the provision of such a configuration, the interval between the bonding pads 9 adjacent to each other is made wide as viewed in the direction of arrangement of the bonding pads 9. Therefore, productivity in a stud bump forming process and a wire bonding process is enhanced. The wiring of an interposer 21 also contributes to enhancement of productivity in that its wiring becomes easy.

(Embodiment 5)

Figure 18:
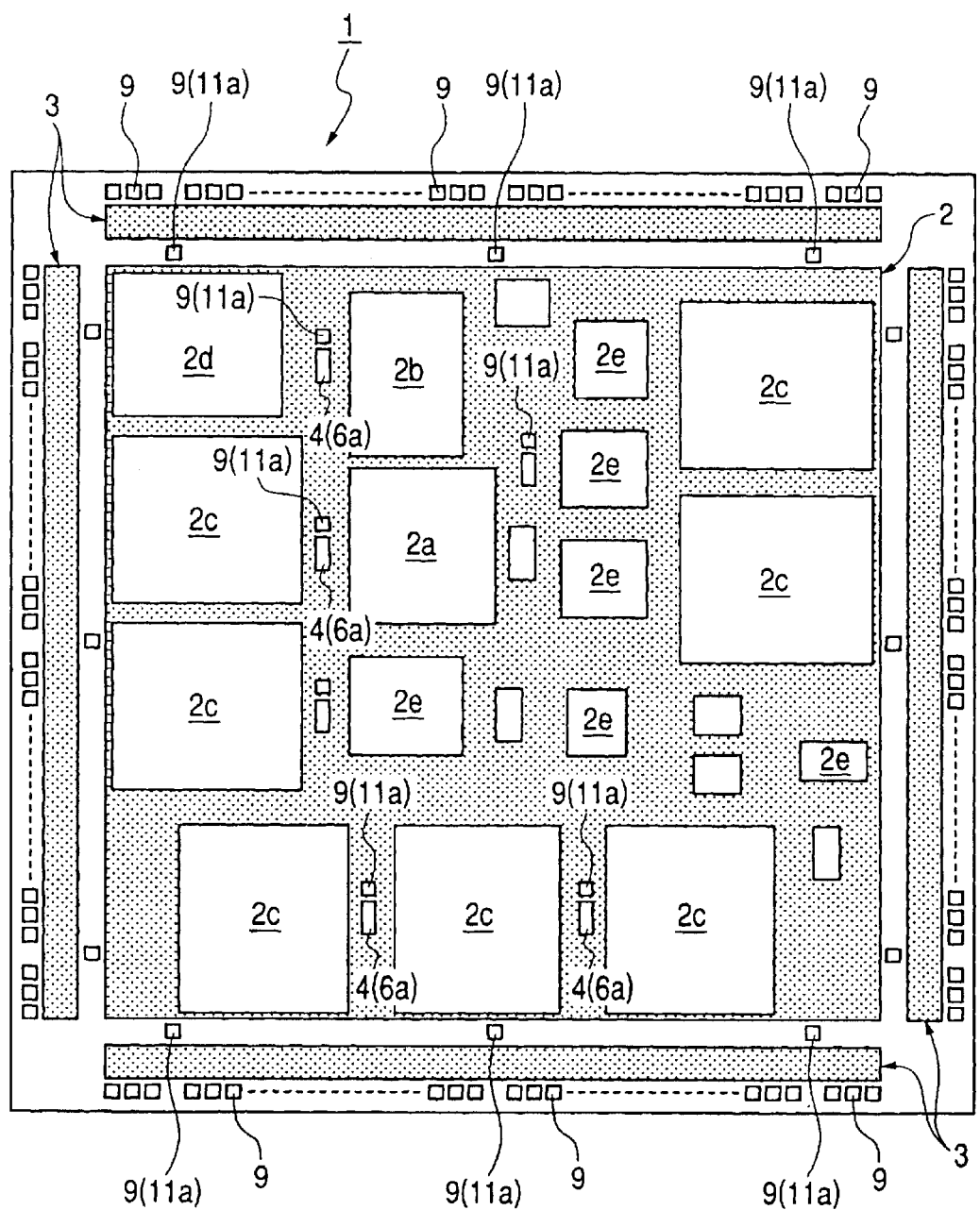
FIG. 18 is a typical plan view depicting a layout of a semiconductor integrated circuit device illustrative of an embodiment 5 of the present invention.

FIG. 18 is a typical plan view showing a layout of a microcomputer illustrative of the present embodiment 5.

As shown in FIG. 18, a plurality of circuit blocks (2a, 2b, 2c, 2d and 2e) partitioned by wiring channel forming areas are disposed in an internal circuit forming section 2. Wirings for wire-connecting among the respective circuit blocks are formed in the wiring channel areas.

Power supply cells 6a for internal circuit and power supply pads 11a therefor are disposed in the internal circuit forming section 2. The power supply cells 6a and power supply pads 11a are disposed in areas that do not overlap with the circuit blocks in a plane manner, i.e., wiring channel forming areas. Owing to the provision of such a configuration, the characteristics of a power supply system for internal circuit can be enhanced. Since transistor elements that constitute each circuit are not formed in the wiring channel forming areas, it is possible to suppress a failure caused by impact that occurs when stud bumps or bonding wires are connected to the power supply pads 11a.

Incidentally, the power supply cells 6a in the internal circuit forming section 2 may be omitted.

(Embodiment 6)

Figure 19:
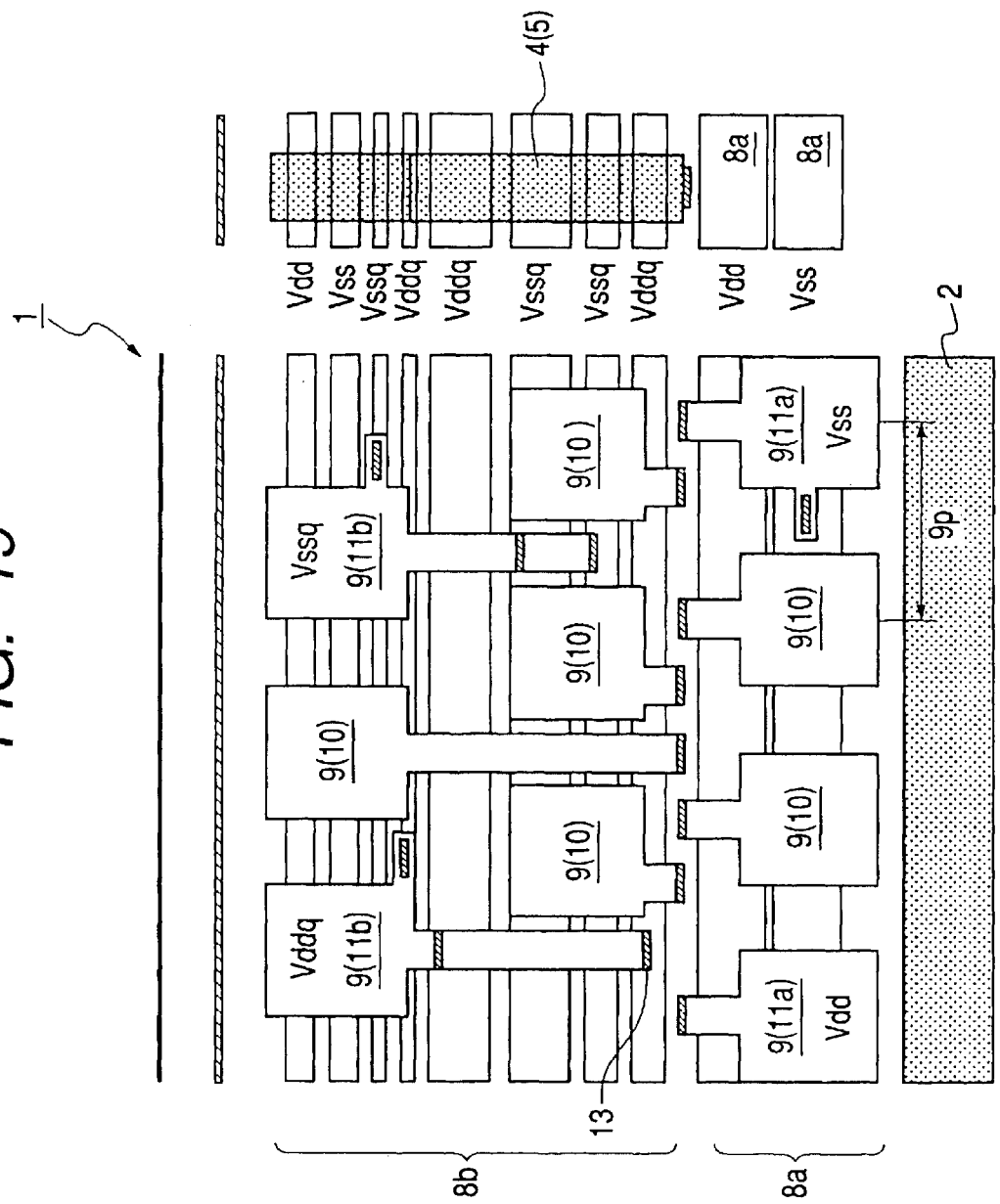
FIG. 19 is a typical plan view showing a layout of a semiconductor integrated circuit device illustrative of an embodiment 6 of the present invention.

FIG. 19 is a typical plan view showing a layout of part of a microcomputer illustrative of the present embodiment 6.

While the signal pads 10 and the signal cells 5 are respectively electrically connected to one another on the outer sides (on the sides of the semiconductor chip 1) of the signal cells 5 in the above embodiment, signal pads 10 and signal cells 5 are respectively electrically connected to one another inside (on the internal circuit forming section 2 side) the signal cells 5 in the present embodiment. Owing to the provision of such a configuration, the distance between each bonding pad 9 and each connecting portion 13 becomes short so that circuit characteristics are enhanced. Since logic areas 15 in input/output cells 4 relatively susceptible to the influence of stress or impact are disposed on the peripheral side (edge side) of the semiconductor chip 1, it becomes easy to lay out the bonding pads 9. In the present embodiment, the bonding pads 9 are arranged in four rows.

(Embodiment 7)

Figure 20:
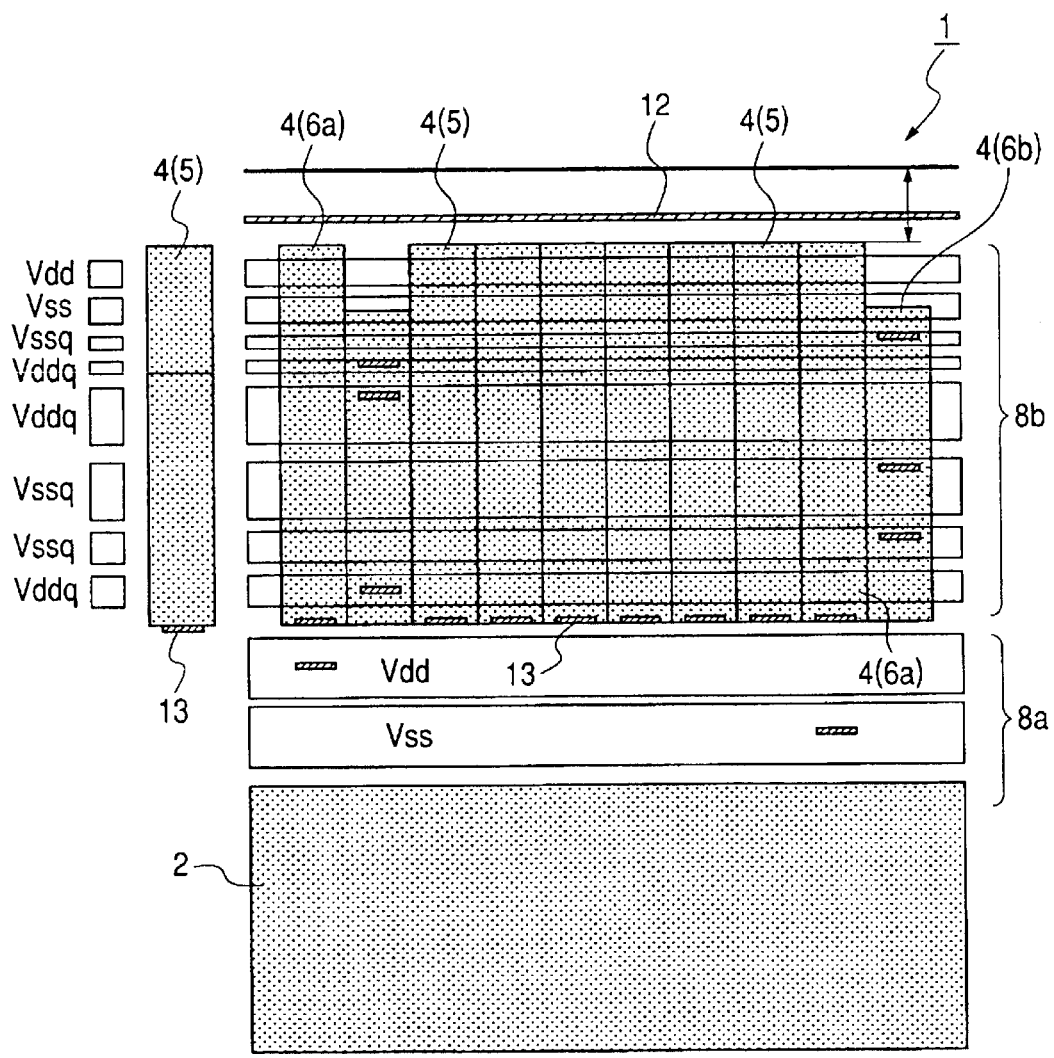
FIG. 20 is a typical plan view depicting a layout of a semiconductor integrated circuit device illustrative of an embodiment 7 of the present invention.
Figure 21:
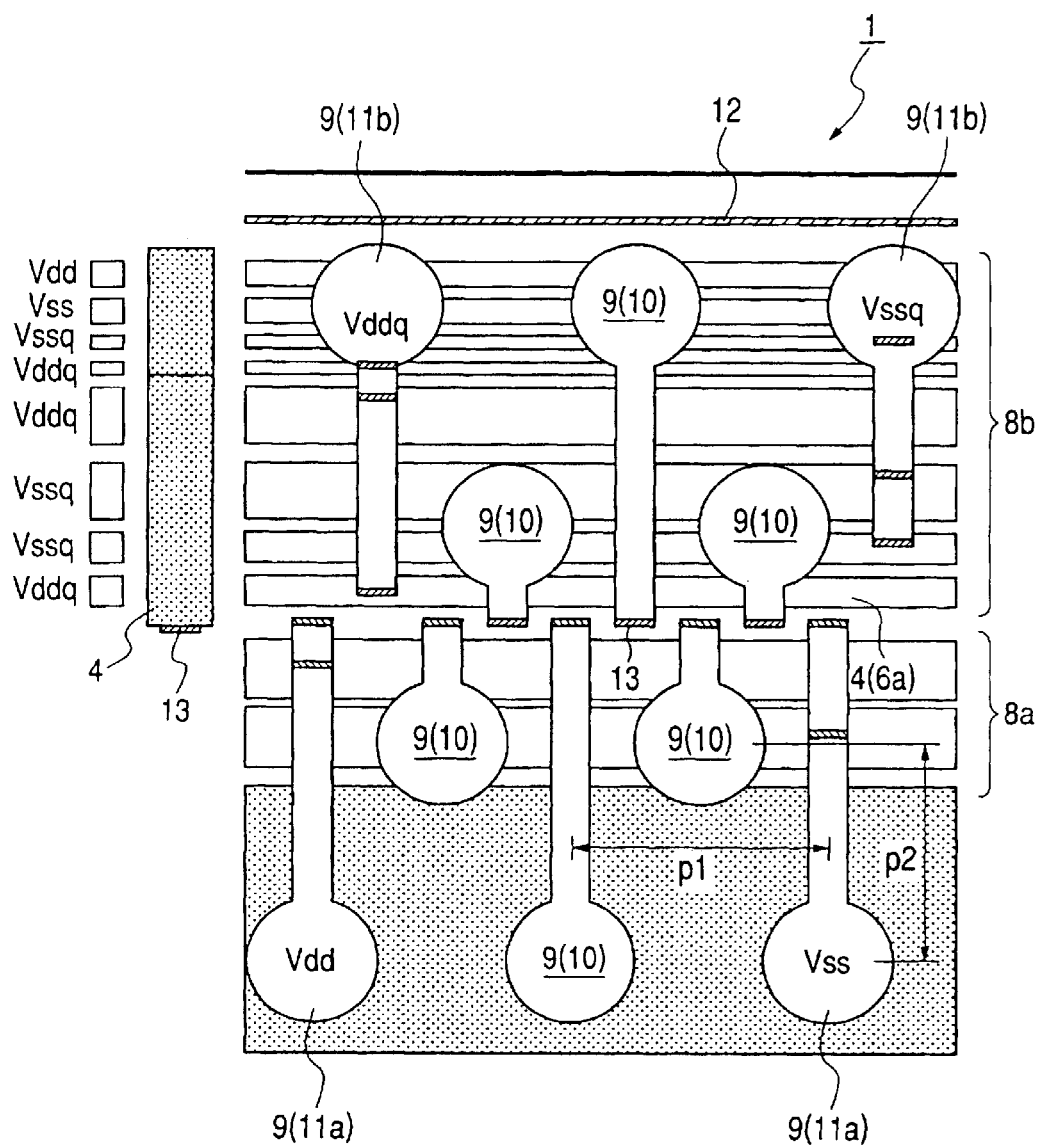
FIG. 21 is a typical plan view illustrating the layout of the semiconductor integrated circuit device illustrative of the embodiment 7 of the present invention.
Figure 22:
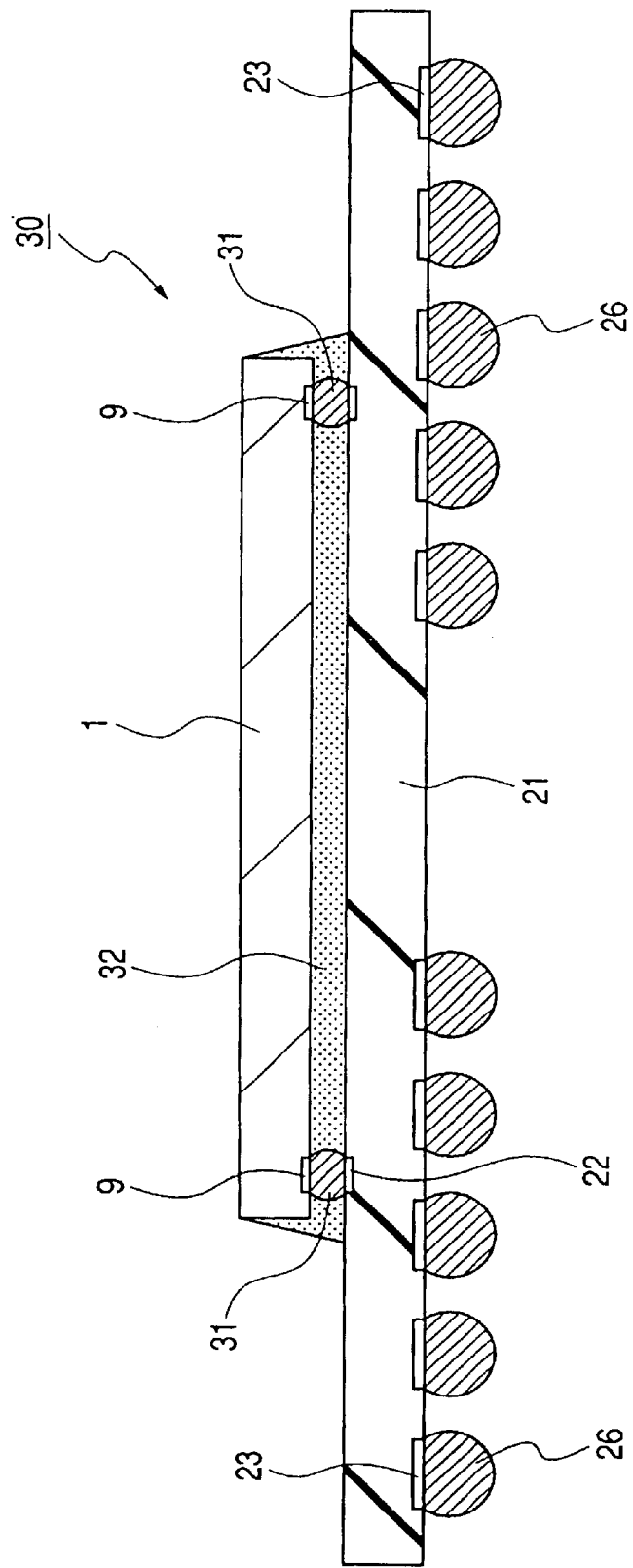
FIG. 22 is a typical cross-sectional view showing a schematic configuration of a BGA type semiconductor device in which the semiconductor integrated circuit device showing the embodiment 7 of the present invention is built.
Figure 23:
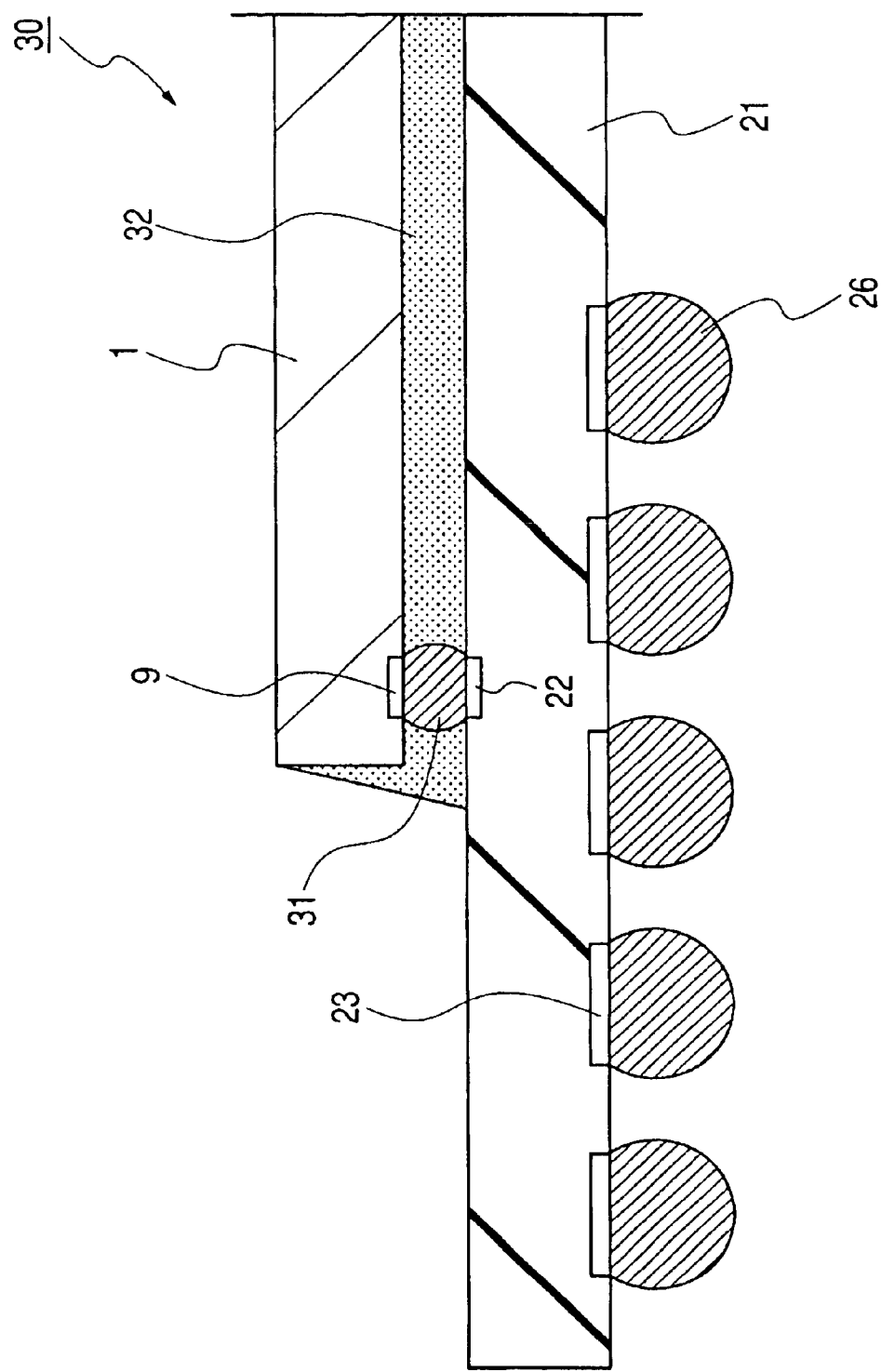
FIG. 23 is a typical cross-sectional view illustrating part of FIG. 22 in an enlarged form.

FIG. 20 is a typical plan view showing a layout of part of a microcomputer illustrative of the present embodiment 7, and FIG. 21 is a typical plan view showing the state of arrangement of bonding pads in the same areas as FIG. 20, FIG. 22 is a typical cross-sectional view showing a schematic configuration of a BGA type semiconductor device in which a semiconductor integrated circuit device (semiconductor chip) of the present embodiment 7, and FIG. 23 is a typical cross-sectional view showing par of FIG. 22 in an enlarged form.

The present embodiment is identical to the embodiment 6 in that as shown in FIGS. 20 and 21, the electrical connections of the signal cells 5 and the signal pads 10 are performed inside (on the sides of the semiconductor chip 1) the signal cells 5.

As shown in FIGS. 22 and 23, the semiconductor chip (microcomputer 1) and its corresponding wiring board 21 are electrically connected to each other by solder bumps 31 in the BGA type semiconductor device 30 according to the present embodiment. Thus, the bonding pads 9 shown in FIG. 21 come to shapes taken as bump lands for solder bump connection (e.g., their plane shapes come to circular forms).

As shown in FIGS. 22 and 23, the BGA type semiconductor device 30 has a configuration wherein the semiconductor chip 1 is mounted on the main surface side of the wiring board (interposer) 21, and a plurality of solder bumps (solder balls) 26 are disposed on the back surface side opposite to the main surface of the wiring board 21 as external connecting terminals.

The semiconductor chip 1 is packaged in a state of its main surface being face-to-face with the main surface of the wiring board 21. The plural solder bumps 31 are interposed between the semiconductor chip 1 and the wiring board 21. The plural solder bumps 31 are respectively disposed between the respective bonding pads (bump lands in the present embodiment) 9 of the semiconductor chip 1 and respective pads (connecting portions each made up of wiring's part) of the wiring board 21 and electrically and mechanically connect the bonding pads 9 and pads 22 respectively.

An under fill resin 32 made of, for example, an epoxy thermosetting insulating resin is charged (injected) into a space area between the semiconductor chip 1 and the wiring board 21. After the semiconductor chip 1 has been packaged on the wiring board 21, the under fill resin 32 is injected between the wiring board 21 and the semiconductor chip 1. The solder bumps 31 are formed by, for example, supplying solder balls onto their corresponding bonding pads of the semiconductor chip 1, and thereafter applying heat treatment thereto to thereby melt the solder balls. The packaging of the semiconductor chip 1 is performed by disposing the semiconductor chip 1 formed with the solder bumps 31 over the wiring board 21 and thereafter applying heat treatment thereto to thereby melt the solder bumps 31.

Since no impact is applied even upon bump formation or when the semiconductor chip 1 and the wiring board 21 are connected, in the case of the system of connection by the solder bumps 31, the bonding pads 9 can be placed in any locations on the semiconductor chip 1. FIG. 21 shows the layout of pads in four rows. A pad pitch p1 can be increased (to about 200 $\mu$m, for example).

Incidentally, the bonding pads 9 can be laid out in two, three or five or more rows.

(Embodiment 8)

Figure 24:
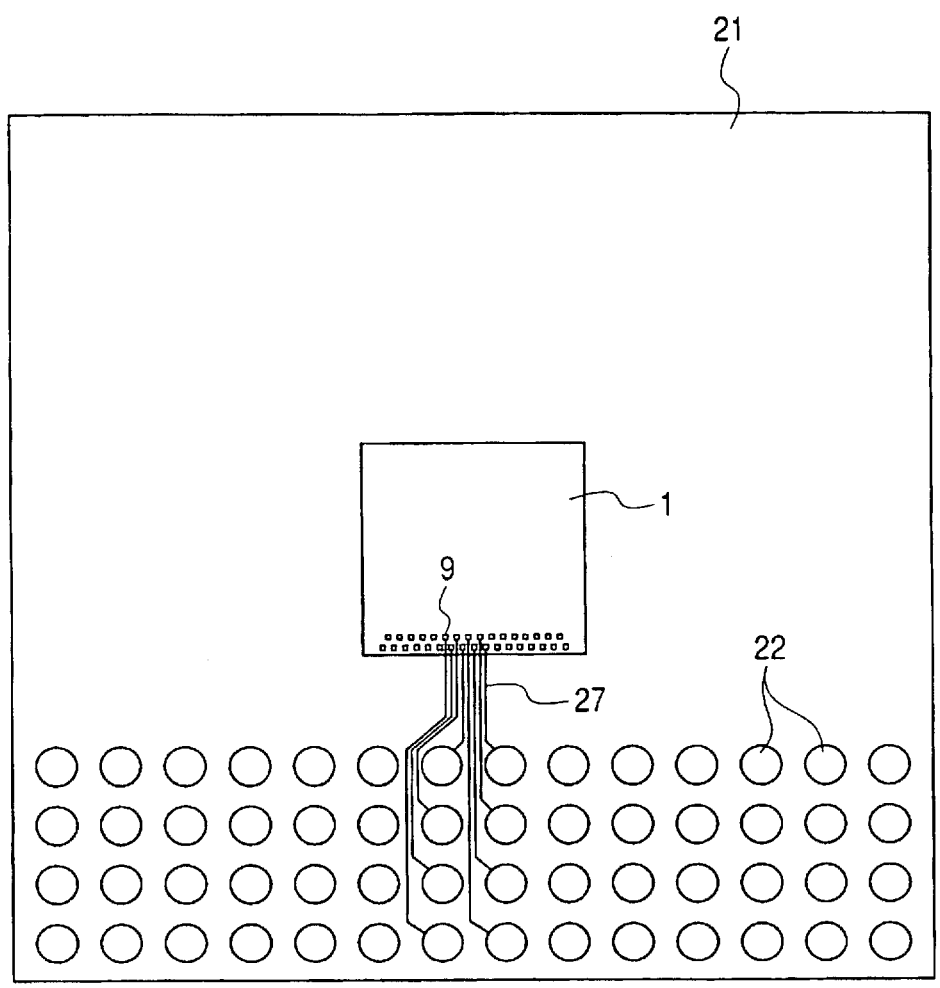
FIG. 24 is a typical view showing the relationship of connections between bonding pads of a semiconductor chip and pads on the back surface side of a wiring board both employed in a BGA type semiconductor device showing an embodiment 8 of the present invention.
Figure 25:
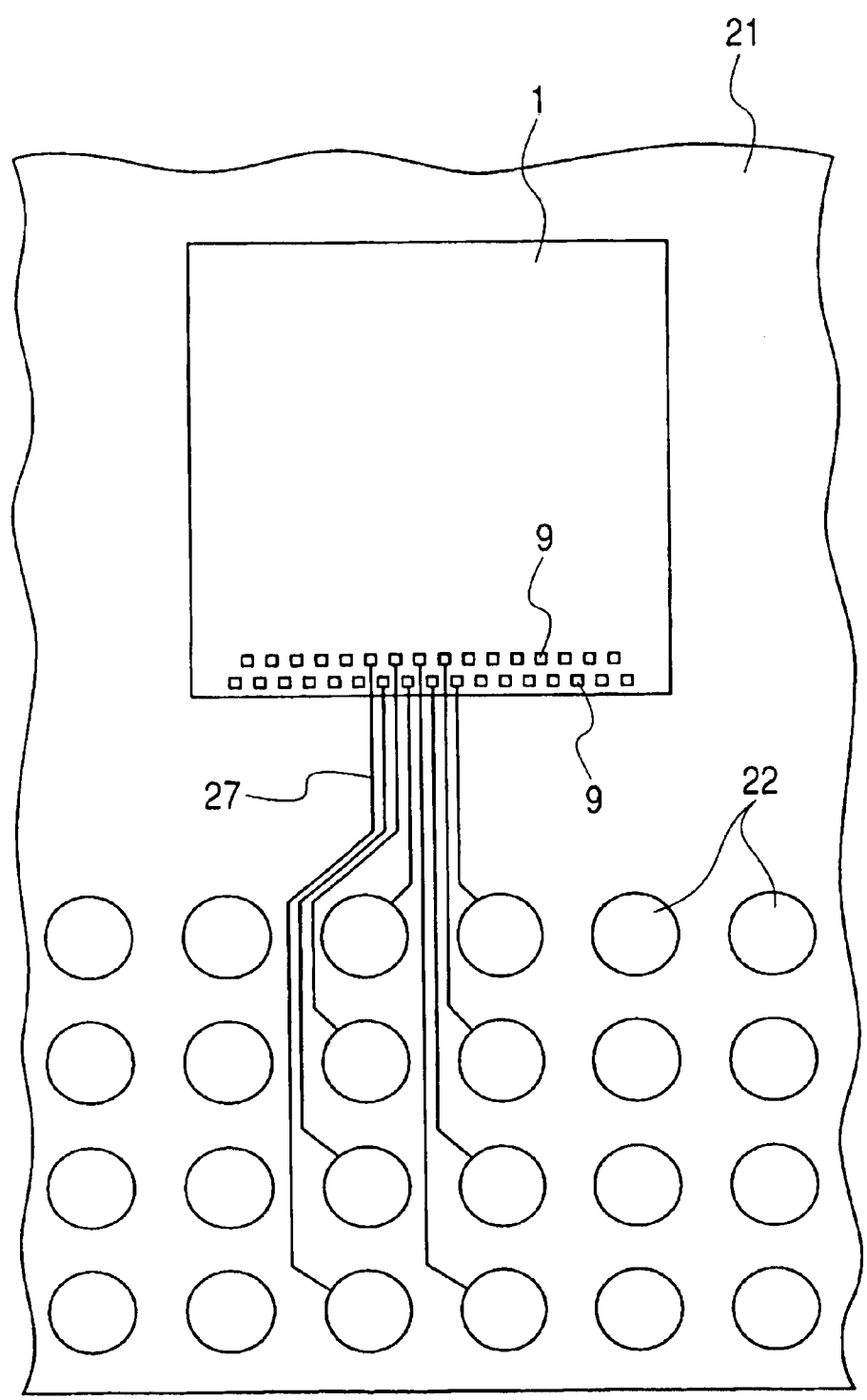
FIG. 25 is a typical view illustrating part of FIG. 24 in an enlarged form.

FIG. 24 is a typical view showing the relationship of connections between bonding pads of a semiconductor chip and pads on the back surface side of a wiring board both employed in a BGA type semiconductor device showing the present embodiment 8, and FIG. 25 is a typical view showing part of FIG. 24 in an enlarged form.

As shown in FIGS. 24 and 25, a plurality of bonding pads 9 of a semiconductor chip 1 are laid out in a zigzag arrangement in which first pads 9 located on the side of the semiconductor chip 1 and second pads 9 located away from the first pads 9 as viewed from the side of the semiconductor chip 1 are alternately and repeatedly disposed along the side (edge) of the semiconductor chip 1. A first pad group (corresponding to a first row as counted from the side of the semiconductor chip 1) comprising the plural first pads 9 includes signal pads 10 and power supply pads 11b for input/output cell. A second pad group (corresponding to a second row as counted from the side of the semiconductor chip 1) comprising the plural second pads 9 includes power supply pads 11a for internal circuit.

Figure 26:
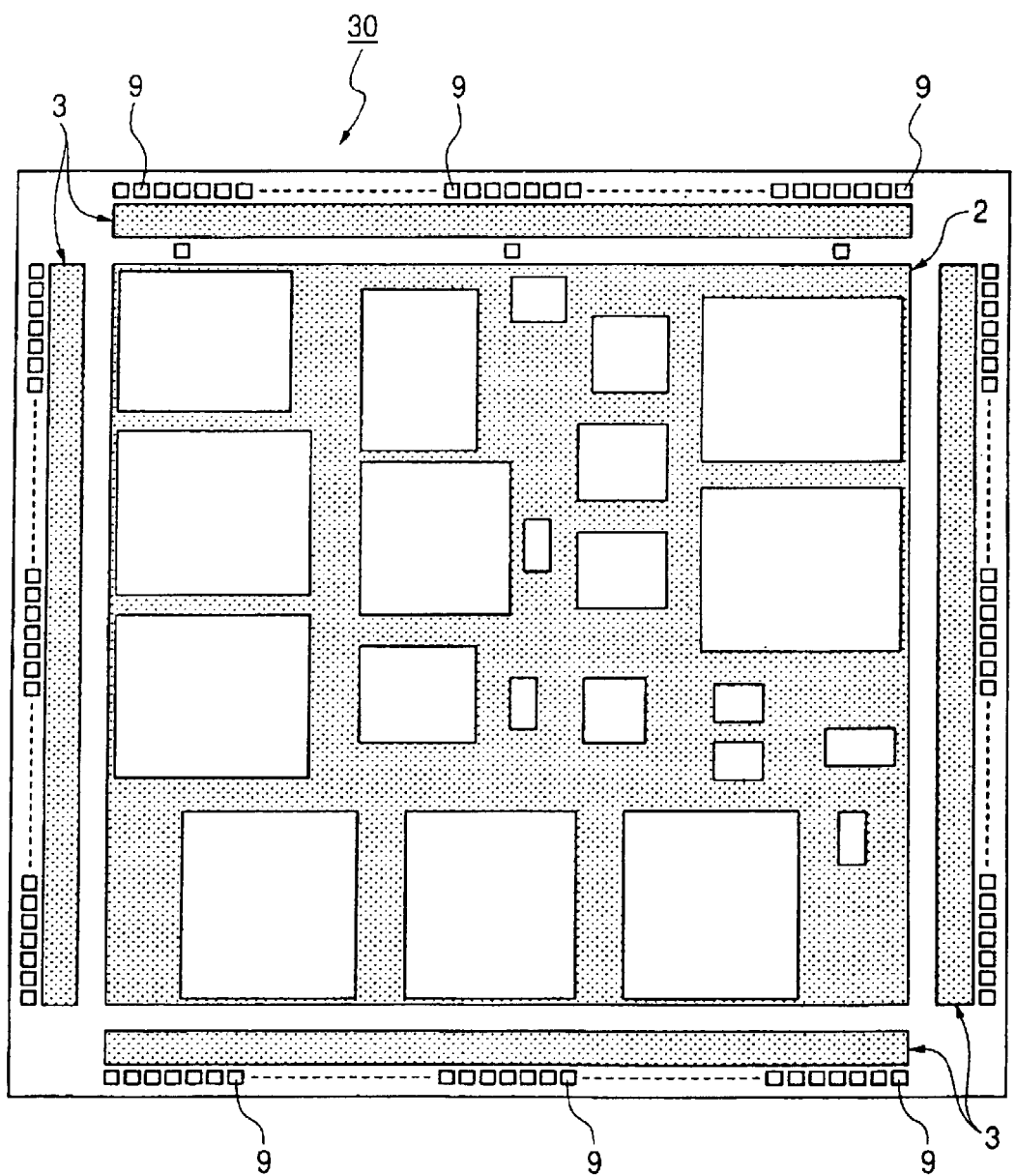
FIG. 26 is a typical plan view showing a layout of a conventional semiconductor integrated circuit device.

Although not shown in FIGS. 25 and 26, pads (see FIGS. 23 and 24) 22 of a wiring board 21, which are respectively electrically connected to the bonding pads 9 of the semiconductor chip 1, are disposed corresponding to the bonding pads 9 of the semiconductor chip 1. That is, the pads 22 of the wiring board 21 are laid out in a zigzag arrangement in which in a chip mounting area (area in which the semiconductor chip 1 is mounted) of the wiring board 21, first pads 22 located on the side of the wiring board 21 and second pads 22 located away from the first pads 22 as viewed from the side of the wiring board 21 are alternately and repeatedly disposed along the side (edge) of the wiring board 21.

A plurality of pads 23 on the back surface side of the wiring board 21 are disposed in a peripheral area of the wiring board 21 in plural rows (four rows in the present embodiment). That is, the plural pads 23 are disposed around the semiconductor chip 1 except for just below the semiconductor chip 1.

Wirings 27 for electrically connecting the pads 22 placed over the main surface of the wiring board and the pads 23 provided over its back surface are disposed over the main surface of the wiring board 21 in plural form. The plural wirings 27 are led out from the chip mounting area (area in which the semiconductor chip 1 is mounted) of the wiring board 21 to the periphery of the wiring board 21. Of the plural wirings 27, the wirings 27 for electrically connecting the second pads 22 and the pads 23 are led out from the chip mounting area of the wiring board 21 to its periphery through spaces between the first pads 22. Owing to the provision of such a configuration, the semiconductor device 30 can be enhanced in power supply and brought into less size.

While the invention developed above by the present inventors has been described specifically based on the illustrative embodiments, the present invention is not limited to the embodiments. It is needless to say that various changes can be made thereto within the scope not departing from the substance thereof.

Advantageous effects obtained by a typical one of the inventions disclosed in the present application will be described in brief as follows:

According to the present invention, the characteristics of each circuit for a semiconductor integrated circuit device can be maintained or enhanced and its size reduction can be simultaneously made. The characteristics of the circuit in this case intend to reduce the parasitic resistance of each connecting wiring for power supply and lower the impedance of a power supply system. With the reduction in the impedance of the power supply system, an operating voltage margin for the circuit characteristics can be expanded. Further, noise can be reduced, and a timing margin at the circuit's operation with the reduction in noise can be expanded.

What is claimed is:

1. A semiconductor integrated circuit device, comprising:
   a semiconductor substrate squared in plane surface;
   a plurality of pads disposed over a main surface of the semiconductor substrate along one side of the semiconductor substrate;
   a plurality of input/output cells disposed corresponding to the plural pads over the main surface of the semiconductor substrate;
   an internal circuit forming section disposed over the main surface of the semiconductor substrate and inner than the plural input/output cells; and
   power supply wirings for internal circuit, for supplying potentials to the internal circuit forming section, said power supply wirings being respectively disposed inner than the plural input/output cells,
   wherein the plural input/output cells include signal cells and power supply cells for internal circuit respectively,
   wherein the plural pads includes signal pads respectively disposed corresponding to the signal cells and electrically connected the signal cells, and power supply pads for internal circuit respectively disposed corresponding to the power supply cells and electrically connected to the power supply cells and the power supply wirings, and
   wherein the power supply pads are disposed closer to the power supply wirings than the signal pads.

2. The semiconductor integrated circuit device according to claim 1, wherein the power supply pads are respectively disposed inner than the input/output cells respectively.

3. The semiconductor integrated circuit device according to claim 1, wherein the power supply pads are respectively disposed so as to overlap with the power supply wirings in a plane manner.

4. The semiconductor integrated circuit device according to claim 1, wherein the signal pads are respectively disposed outer than the input/output cells.

5. The semiconductor integrated circuit device according to claim 1, wherein the signal pads are respectively disposed inner than outer ends of the input/output cells.

6. The semiconductor integrated circuit device according to claim 1, wherein the power supply wirings are disposed outer than the internal circuit forming section.

7. The semiconductor integrated circuit device according to claim 1, wherein the power supply wirings extend so as to surround the internal circuit forming section.

8. The semiconductor integrated circuit device according to claim 1,
   wherein each of the signal cells includes a logic area in which input/output circuits are provided, and a final stage area in which a protective circuit is provided, and
   wherein the logic area is disposed on one side of the semiconductor substrate rather than the final stage area.

9. A semiconductor integrated circuit device, comprising:
   a semiconductor substrate squared in plane surface;
   a plurality of pads disposed over a main surface of the semiconductor substrate along one side of the semiconductor substrate;
   a plurality of input/output cells disposed corresponding to the plural pads over the main surface of the semiconductor substrate;
   an internal circuit forming section disposed over the main surface of the semiconductor substrate and inner than the plural input/output cells;
   power supply wirings for internal circuit, for supplying potentials to the internal circuit forming section, said power supply wirings being respectively disposed inner than the plural input/output cells; and
   power supply wirings for input/output cells, for respectively supplying potentials to the plural input/output cells, said power supply wirings extending along one side of the semiconductor substrate so as to overlap with the plural input/output cells in a plane manner,
   wherein the plural input/output cells include signal cells, power supply cells for internal circuit, and power supply cells for input/output cells respectively,
   wherein the plural pads respectively include signal pads disposed corresponding to the signal cells and electrically onnected to the signal cells, power supply pads for internal circuit respectively disposed corresponding to the power supply cells for internal circuit and electrically connected to the power supply cells for internal circuit and the power supply wirings for internal circuit, and power supply pads for input/output cells respectively disposed corresponding to the power supply cells for input/output cells and electrically connected to the power supply cells for input/output cells and the power supply wirings for input/output cells, and
   wherein the power supply pads for internal circuit are disposed closer to the power supply wirings for internal circuit than the signal pads.

10. The semiconductor integrated circuit device according to claim 9, wherein the power supply pads for internal circuit are respectively disposed inner than the input/output cells.

11. The semiconductor integrated circuit device according to claim 9, wherein the power supply pads for internal circuit are respectively disposed so as to overlap with the power supply wirings for internal circuit in a plane manner.

12. The semiconductor integrated circuit device according to claim 9, wherein the signal pads and the power supply pads for input/output cells are respectively disposed outer than the input/output cells.

13. The semiconductor integrated circuit device according to claim 9, wherein the signal pads are respectively disposed so as to overlap with the input/output cells in a plane manner, and wherein the power supply pads for input/output cells are respectively disposed so as to overlap with the power supply cells for input/output cells in a plane manner.

14. The semiconductor integrated circuit device according to claim 9, wherein the power supply wirings for internal circuit are disposed outer than the internal circuit forming section.

15. The semiconductor integrated circuit device according to claim 9, wherein the power supply wirings for internal circuit extend so as to surround the periphery of the internal circuit forming section.

16. The semiconductor integrated circuit device according to claim 9, wherein each of the signal cells includes a logic area in which input/output circuits are provided, and a final stage area in which a protective circuit is provided, and wherein the logic area is disposed on one side of the semiconductor substrate rather than the final stage area.

* * * * *